US008047659B2

(12) United States Patent
Sumiyama et al.

(10) Patent No.: US 8,047,659 B2
(45) Date of Patent: *Nov. 1, 2011

(54) LIGHT SOURCE DEVICE, IMAGE DISPLAY APPARATUS, AND MONITOR APPARATUS

(75) Inventors: Fumika Sumiyama, Matsumoto (JP); Akira Miyamae, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 703 days.

This patent is subject to a terminal disclaimer.

(21) Appl. No.: 12/136,445

(22) Filed: Jun. 10, 2008

(65) Prior Publication Data

US 2009/0016390 A1    Jan. 15, 2009

(30) Foreign Application Priority Data

Jul. 12, 2007    (JP) ................................. 2007-183345

(51) Int. Cl.
*G03B 21/00* (2006.01)
*G03B 21/20* (2006.01)
*H01S 3/10* (2006.01)

(52) U.S. Cl. ............................. 353/85; 353/122; 372/23

(58) Field of Classification Search ................... 353/94, 353/122, 84–85; 362/184, 225, 227, 230–231, 362/233, 235; 372/9, 18, 23, 26, 28, 32, 372/34, 36, 39, 43.01, 50.12, 50.124, 92, 372/98–99, 109, 50.121
See application file for complete search history.

(56) References Cited

U.S. PATENT DOCUMENTS

| 5,193,023 | A | | 3/1993 | Yamada et al. |
| 5,526,145 | A | * | 6/1996 | Weber ............................. 359/15 |
| 5,859,945 | A | | 1/1999 | Kato et al. |
| 6,192,170 | B1 | | 2/2001 | Komatsu |
| 6,317,170 | B1 | * | 11/2001 | Hwang et al. ................. 348/750 |
| 6,323,987 | B1 | | 11/2001 | Rinaudo et al. |
| 6,488,419 | B2 | | 12/2002 | Kato et al. |
| 6,690,873 | B2 | * | 2/2004 | Bendett et al. ................ 385/132 |
| 6,947,459 | B2 | * | 9/2005 | Kurtz et al. ................ 372/43.01 |
| 7,075,656 | B2 | * | 7/2006 | Hedin .......................... 356/454 |

FOREIGN PATENT DOCUMENTS

JP    A-63-137493    6/1988

(Continued)

OTHER PUBLICATIONS

Mooradian et al., "High Power Extended Vertical Cavity Surface Emitting Diode Lasers and Arrays and their Applications," *Microoptics Conference-Tokyo*, Nov. 2, 2005, pp. 1-4.

*Primary Examiner* — Tony Ko
*Assistant Examiner* — Jori S Reilly-Diakun
(74) *Attorney, Agent, or Firm* — Oliff & Berridge, PLC

(57) ABSTRACT

A light source device includes plural light-emitting elements that emit lights, a wavelength selection element that has plural light selection areas in which wavelength selection is performed for the lights emitted from the plural light-emitting elements, respectively, and selectively reflects a part of the lights emitted from the plural light-emitting elements, a state detecting unit that detects states of the plural light selection areas of the wavelength selection element, and a state changing unit that changes, according to the states of the plural light selection areas detected by the state detecting unit, the states of the light selection areas of the wavelength selection element to make wavelengths of the lights selected in the plural light selection areas different from one another.

19 Claims, 12 Drawing Sheets

U.S. PATENT DOCUMENTS

| | | |
|---|---|---|
| 7,376,168 B2 | 5/2008 | Mikhailov et al. |
| 7,905,608 B2 * | 3/2011 | Sumiyama et al. ............. 353/85 |
| 2003/0034985 A1 * | 2/2003 | Needham Riddle et al. . 345/589 |
| 2003/0133485 A1 * | 7/2003 | Liu ................................. 372/50 |
| 2006/0023173 A1 | 2/2006 | Mooradian et al. |
| 2006/0023757 A1 | 2/2006 | Mooradian et al. |
| 2006/0082679 A1 * | 4/2006 | Chua et al. .................... 348/371 |
| 2006/0165144 A1 | 7/2006 | Mikhailov et al. |
| 2006/0268241 A1 | 11/2006 | Watson et al. |
| 2006/0280219 A1 | 12/2006 | Shchegrov |
| 2007/0153862 A1 | 7/2007 | Shchegrov et al. |
| 2007/0153866 A1 | 7/2007 | Shchegrov et al. |
| 2009/0059992 A1 | 3/2009 | Sumiyama et al. |

FOREIGN PATENT DOCUMENTS

| | | |
|---|---|---|
| JP | A-4-19719 | 1/1992 |
| JP | A-5-13862 | 1/1993 |
| JP | A-8-190111 | 7/1996 |
| JP | A-9-49948 | 2/1997 |
| JP | A-11-87826 | 3/1999 |
| JP | A-11-233894 | 8/1999 |
| JP | A-2000-174397 | 6/2000 |
| JP | A-2001-15856 | 1/2001 |
| JP | A-2001-66718 | 3/2001 |
| JP | A-2001-189520 | 7/2001 |
| JP | A-2001-339118 | 12/2001 |
| JP | A-2002-232049 | 8/2002 |
| JP | A-2002-303904 | 10/2002 |
| JP | A-2003-158318 | 5/2003 |
| JP | A 2004-503923 | 2/2004 |
| JP | A-2004-144794 | 5/2004 |
| JP | A-2004-144936 | 5/2004 |
| JP | A-2005-537643 | 12/2005 |
| WO | WO 02/05038 A2 | 1/2002 |
| WO | WO 2006/105249 A2 | 10/2006 |
| WO | WO 2007/092710 A2 | 8/2007 |

\* cited by examiner

LIGHT SOURCE DEVICE, IMAGE DISPLAY APPARATUS, AND MONITOR APPARATUS

BACKGROUND

1. Technical Field

The present invention relates to a light source device, an image display apparatus, and a monitor apparatus.

2. Related Art

In projection type image display apparatuses in recent years, in general, a discharge lamp such as a super-high pressure mercury lamp is used as a light source. However, such a discharge lamp has problems in that durable life is short, instantaneous lighting is difficult, a color reproducibility range is narrow, and an ultraviolet ray radiated from the lamp deteriorates a liquid crystal light valve. Therefore, a projection type image display apparatus including a laser light source that irradiates monochromatic light is proposed instead of such a discharge lamp. The laser light source does not have the problems described above but is disadvantageous in that the laser light source has coherence. Consequently, an interference fringe appears as speckle noise and an image is deteriorated on a projection surface on which a laser beam is projected. Therefore, in order to display a high-definition image, measures against the speckle noise are necessary.

As means for removing speckle noise, plural light-emitting elements having center wavelengths slightly different from one another in design are provided in array. This makes it possible to reduce speckle noise by obtaining a wider spectrum band compared with that obtained when one light-emitting element is used (see JP-T-2004-503923 term "JP-T" as used herein means a published Japanese translation of a PCT patent application).

The means for removing speckle noise described in JP-T-2004-503923 is devised on the premise that a light source that does not need an external resonator structure, i.e., a light source that directly outputs laser beam is used. Indeed, in the case of the light source that does not need the external resonator structure, there is an effect that speckle noise is suppressed.

In the case of a light source including an external resonator, basic components are a light-emitting element and a wavelength selection element (a resonator mirror). Even when plural light-emitting elements are used, taking into account cost and easiness of assembly, it is a general practice to use a wavelength selection element that selects a single wavelength. In the wavelength selection element, for laser oscillation, it is necessary to narrow a band of a wavelength to be selected. As a result, as described in JP-T-2004-503923, even if wavelengths of lights emitted from the array light sources are varied, a single wavelength is selected by the wavelength selection element. Therefore, coherence of the light source as whole including the light selection element does not decrease.

SUMMARY

An advantage of some aspects of the invention is to provide a light source device, an image display apparatus, and a monitor apparatus in which coherence among plural laser beams is reduced and speckle noise is suppressed.

According to an aspect of the invention, there is provided a light source device including plural light-emitting elements that emit lights, a wavelength selection element that has plural light selection areas in which wavelength selection is performed for the lights emitted from the plural light-emitting elements, respectively, and selectively reflects a part of the lights emitted from the plural light-emitting elements, a state detecting unit that detects states of the plural light selection areas of the wavelength selection element, and a state changing unit that changes, according to the states of the plural light selection areas detected by the state detecting unit, the states of the light selection areas of the wavelength selection element to make wavelengths of the lights selected in the plural light selection areas different from one another.

In the light source device according to the aspect of the invention, among the lights emitted from the plural light-emitting elements, a part of the lights having a predetermined selected wavelength resonates and is amplified between the light-emitting elements and the wavelength selection element and the remaining lights are transmitted without being amplified. The state detecting unit detects states of the plural light selection areas of the wavelength selection element. The state changing unit changes, according to the detected states, the states of the light selection areas of the wavelength selection element to make wavelength of the lights selected in the plural light selection areas different from one another. Consequently, wavelengths of the lights selected in the respective light selection areas are different. Therefore, even if peak wavelengths of the lights emitted from the plural light-emitting elements are the same, since the lights emitted from the light-emitting elements have a certain degree of band width, the lights having the different wavelengths are amplified in the band width and extracted. In other words, when the respective lights emitted from the light-emitting elements resonate in the respective light selection areas of the wavelength selection element, the lights are amplified in a resonator mirror structure between the light source and the wavelength selection element. As a result, wavelengths of the lights emitted from the respective areas are different. Therefore, in the invention, unlike the related art, since the wavelength selection element does not emit light having a single wavelength, the lights transmitted through the wavelength selection element spread as a whole. Consequently, since coherence among the amplified lights emitted from the respective areas of the wavelength selection element decreases, it is possible to suppress speckle noise.

The states of the light selection areas of the wavelength selection element are changed by the state changing unit according to the states detected by the state detecting unit. Therefore, it is possible to surely make the wavelengths of the lights emitted from the plural light selection areas different.

It is preferable that, in the light source device according to the aspect of the invention, the state detecting unit and the state changing unit are provided for each of the light selection areas of the wavelength selection element.

In the light source device according to the aspect of the invention, the state detecting unit and the state changing unit are provided in each of the plural light selection areas in the wavelength selection element. In this case, states of the respective light selection areas of the wavelength selection element are detected by the state detecting unit. States of the respective plural light selection areas of the wavelength selection element are changed according to the detected states to make wavelength of lights selected in the respective light selection areas different from one another. In other words, since the state can be changed for each of the light selection areas, a degree of freedom of a change in an output wavelength distribution of the lights emitted from the wavelength selection element increases. Therefore, it is possible to align wavelengths of the lights emitted from the light-emitting elements and wavelengths of the lights selected in the respective light selection areas of the wavelength selection element corresponding to the light-emitting elements. Consequently, even if the output wavelengths are varied because of manufacturing errors or the like of the light-emitting elements, it is possible to improve efficiency of use of the lights emitted from the wavelength selection element while reducing speckle noise.

Plural state changing units may be provided and each of the state changing unit may be provided for each of the plural light selection areas. In the case of this configuration, as in the case described above, states of the light selection areas of the wavelength selection element only have to be changed to make wavelengths of the lights selected in the plural light selection areas different from one another.

It is preferable that, in the light source device according to the aspect of the invention, the states of the plural light selection areas are temporally changed by the state changing unit.

In the light source device according to the aspect of the invention, the states of the plural light selection areas are temporally changed by the state changing unit. Consequently, speckle patterns of the lights emitted from the respective light selection areas change complexly as time elapses. According to the change, visually recognized speckles (spot patterns due to interference) move. Therefore, the speckle patterns are integrated and averaged in an after-image time of human eyes and it is possible to reduce occurrence of speckles.

It is preferable that the light source device according to the aspect of the invention includes a light-intensity detecting unit that detects intensities of the lights emitted from the plural light selection areas and intensities of the lights emitted from the plural light-emitting elements are adjusted on the basis of the intensities of the lights detected by the light-intensity detecting unit, respectively.

In the light source device according to the aspect of the invention, it is possible to uniformalize the intensities of the lights emitted from the plural light selection areas by adjusting the intensities of the lights emitted from the plural light-emitting elements on the basis of the intensities of the lights detected by the light-intensity detecting unit, respectively. The effect of the speckle reduction at the time when the wavelengths are made different is larger when the intensities of the lights are uniform as in the aspect of the invention compared with the case in which the intensities of the lights emitted from the respective areas of the wavelength selection element are non-uniform. In other words, it is possible to more effectively reduce coherence of the lights emitted from the wavelength selection element.

It is preferable that, in the light source device according to the aspect of the invention, the state detecting unit is a temperature detecting unit that detects the temperatures in the light selection areas of the wavelength selection element and the state changing unit is a temperature changing unit that makes, according to the temperature detected by the temperature detecting unit, the temperatures in the light selection areas of the wavelength selection element different from one another.

In the light source device according to the aspect of the invention, the temperature in each of the light selection areas of the wavelength selection element is made different by the temperature changing unit. Therefore, intervals of a periodic lattice in the inside of the wavelength selection element change according to the temperatures in the respective light selection areas. Consequently, in the wavelength selection element, wavelengths of the lights selected in the respective light selection areas are different. Therefore, the respective lights emitted from the plural light-emitting elements and emitted from the respective light selection areas of the wavelength selection element are lights having different wavelengths. In this way, intervals of a periodic lattice in the inside of the wavelength selection element changes when the temperatures in the respective light selection areas simply change while an external force is not given to the wavelength selection element. Consequently, coherence among lights reflected on the respective areas of the wavelength selection element and amplified is reduced by a simpler configuration. Therefore, it is possible to suppress speckle noise.

It is preferable that, in the light source device according to the aspect of the invention, the state detecting unit is a distortion detecting unit that detects magnitudes of distortions of the light selection areas of the wavelength selection element and the state changing unit is a distortion giving unit that makes, according to the magnitudes of the distortions detected by the distortion detecting unit, the magnitudes of the distortions of the light selection areas of the wavelength selection element different from one another.

In the light source device according to the aspect of the invention, for example, piezoelectric elements are used as the distortion giving unit to give distortions such that distortion is different in each of the areas of the wavelength selection area. Consequently, since the intervals of the periodic lattice in the inside of the wavelength selection element change, in the wavelength selection element, a wavelength reflected in each of the areas is different. Therefore, when the lights emitted from the plural light-emitting elements are reflected by the wavelength selection element to cause resonance, the amplified lights have different wavelengths when the lights are emitted from the respective areas. Therefore, since coherence among the lights transmitted through the respective areas of the wavelength selection element is reduced by a simple configuration, it is possible to suppress speckle noise while realizing a reduction in cost.

Plural distortion giving units may be provided and each of the distortion giving unit may be provided in each of the plural light selection areas. In the case of this configuration, as in the case described above, distortions only have to be given to make wavelengths of the lights selected in the plural light selection areas different from one another.

According to another aspect of the invention, there is provided a light source device including plural light-emitting elements that emit lights, a wavelength conversion element that has plural light passing areas through which the lights emitted from the plural light-emitting elements pass, respectively, and converts wavelengths of at least a part of the lights emitted from the plural light-emitting elements into lights having a predetermined wavelength, respectively, a wavelength selection element that has plural light selection areas in which the lights emitted from the plural light passing areas of the wavelength conversion element are selected, respectively, and selectively reflects a part of the lights emitted from the wavelength conversion element to the light-emitting element, a conversion-side-state detecting unit that detects states of the plural light passing areas of the wavelength conversion element, a conversion-side-state changing unit that changes, according to the states of the plural light passing areas detected by the conversion-side-state detecting unit, the state of the light passing areas of the wavelength conversion element to make wavelength of the lights converted in the plural light passing areas different from one another, a selection-side-state detecting unit that detects states of the plural light selection areas of the wavelength selection element, and a selection-side-state changing unit that changes, according to the states of the plural light selection areas detected by the selection-side-state detecting unit, the states of the light selection areas of the wavelength selection element to make wavelengths of the lights selected by the plural light selection areas different from one another.

In the light source device according to the aspect of the invention, for example, when green light is emitted, light sources having a wavelength of 1060 nm are used as the light-emitting elements. After wavelengths of the lights emitted from the light-emitting elements are halved by the wavelength conversion element, an element that transmits the green light is used as the wavelength selection element. Consequently, the lights emitted from the light-emitting elements are transmitted through the wavelength conversion element and repeat reflection between the light-emitting elements and the wavelength selection element. Thereafter, the lights converted into green lights are emitted from the wavelength selection element.

In this case, the states of the light passing areas of the wavelength conversion element are changed by the conversion-side-state changing unit according to the states detected by the conversion-side-state detecting unit. Moreover, the states of the light selection areas of the wavelength selection element are changed by the selection-side-state changing unit according to the states detected by the selection-side-state detecting unit. Consequently, it is possible to surely make the wavelengths of the lights emitted from the plural light-passing areas and the plural light selection areas different.

Therefore, it is possible to obtain lights having a desired wavelength using the wavelength conversion element and emit lights with speckle noise suppressed.

It is preferable that, in the light source device according to the aspect of the invention, the conversion-side-state detecting unit and the conversion-side-state changing unit are provided in each of the light passing areas of the wavelength conversion element, the selection-side-state detecting unit and the selection-side-state changing unit are provided in each of the light selection areas of the wavelength selection element, and states of the respective areas are changed by the conversion-side-state changing unit and the selection-side-state changing unit such that converted wavelengths of the respective light passing areas of the wavelength conversion element and selected wavelengths of the respective light selection areas of the wavelength selection element change while substantially coinciding with each other.

In the light source device according to the aspect of the invention, wavelengths of the lights converted in the respective light passing areas of the wavelength conversion element (converted wavelengths) are substantially identical with wavelengths of the lights selected in the respective light selection areas of the wavelength selection element corresponding to the wavelength conversion element. Consequently, the respective lights converted in the respective light passing areas of the wavelength conversion element are effectively extracted when the lights are transmitted through the respective light selection areas of the wavelength selection element corresponding to the wavelength conversion element.

Plural selection-side-state changing unit may be provided and each of the selection-side-state-changing unit may be provided in each of the plural light selection areas. In the case of this configuration, as in the case described above, temperatures only have to be changed to make wavelengths of the lights selected in the plural light selection areas different from one another. Similarly, the conversion-side-state changing unit may be provided in each of the plural light passing areas.

It is preferable that, in the light source device according to the aspect of the invention, at least one of the states of the plural light passing areas and the states of the plural light selection areas are temporally changed.

In the light source device according to the aspect of the invention, at least one of the states of the plural light passing areas and the states of the plural light selection areas are temporally changed. Consequently, speckle patterns of the lights emitted from the light selection areas of the wavelength selection element complexly change as time elapses. According to the change, visually recognized speckles (spot patterns due to interference) move. Therefore, the speckle patterns are integrated and averaged in an after-image time of human eyes and it is possible to reduce occurrence of speckles.

It is preferable that the light source device according to the aspect of the invention includes a light-intensity detecting unit that detects intensities of the lights emitted from the plural light selection areas, respectively, and intensities of the lights emitted from the plural light-emitting elements are adjusted on the basis of the intensities of the lights detected by the light-intensity detecting unit, respectively.

In the light source device according to the aspect of the invention, it is possible to obtain an effect same as that in the light source device including the light-intensity detecting unit.

It is preferable that, in the light source device according to the aspect of the invention, the wavelength conversion element has a repeated structure of domains with polarizations inverted from one another along center axes of lights emitted from the plural light-emitting elements, the conversion-side-state detecting unit is a voltage converting unit that detects voltages in the light passing areas of the wavelength conversion element, and the conversion-side-state changing unit is a voltage applying unit that makes, according to the voltages detected by the voltage detecting unit, voltages applied to the light passing areas of the wavelength conversion element different from one another.

In the light source device according to the aspect of the invention, applied voltages applied to the voltage applying units of the respective light passing areas of the wavelength conversion element are made different from one another according to the voltages detected by the voltage detecting unit. Therefore, a refractive index is surely different in each of the light passing areas of the wavelength conversion element. By changing a voltage applied to each of the light passing areas of the wavelength conversion element in this way, it is possible to make output wavelengths of the lights emitted from the plural light-emitting elements and wavelengths of the lights transmitted through the respective light passing areas of the wavelength conversion element corresponding to the respective light-emitting elements identical. Moreover, it is possible to make wavelengths of the lights converted in the respective light passing areas of the wavelength conversion element and wavelengths of the lights selected in the respective light selection areas of the wavelength selection element corresponding to the respective light passing areas identical. Consequently, it is possible to change wavelengths of the lights converted in the respective light passing areas of the wavelength conversion element. Therefore, it is possible to obtain a light source device that suppresses speckle noise while improving efficiency of use of the lights emitted from the plural light-emitting elements with a simpler configuration.

It is preferable that, in the light source device according to the aspect of the invention, the selection-side-state detecting unit is a temperature detecting unit that detects the temperatures in the light selection areas of the wavelength selection element and the selection-side-state changing unit is a temperature changing unit that makes temperatures in the light selection areas of the wavelength selection element different from one another according to the temperatures detected by the temperature detecting unit.

In the light source device according to the aspect of the invention, it is possible to obtain an effect same as that of the light source device in which the state detecting unit is the temperature detecting unit and the state changing unit is the temperature changing unit.

It is preferable that, in the light source device according to the aspect of the invention, the selection-side-state detecting unit is a distortion detecting unit that detects magnitudes of distortions of the light selection areas of the wavelength selection element and the selection-side-state changing unit is a distortion giving unit that makes magnitudes of the distortions of the light selection areas of the wavelength selection element different from one another according to the magnitudes of the distortions detected by the distortion detecting unit.

In the light source device according to the aspect of the invention, it is possible to obtain an effect same as that of the light source device in which the state detecting unit is the distortion detecting unit and the state changing unit is the distortion giving unit.

According to still another aspect of the invention, there is provided an image display apparatus including the light source device, a light modulating device that modulates light emitted from the light source device according to an image signal, and a projecting device that projects an image formed by the light modulating device.

In the image display apparatus according to the aspect of the invention, the light emitted from the light source device is made incident on the light modulating device. The image formed by the light modulating device is projected by the projecting device. In this case, since the light emitted from the light source device is light with reduced coherence as described above, the light projected by the projecting device is light with suppressed speckle noise. Therefore, it is possible to display a satisfactory image.

The image display apparatus according to the aspect of the invention includes the light source device and a scanning unit that scans light emitted from the light source device on a projection surface.

In the image display apparatus according to the aspect of the invention, the light emitted from the light source device is scanned by the scanning unit. The light scanned by the scanning unit is projected on the projection surface. In this case, since the light emitted from the light source device is light with reduced coherence as described above, light irradiated on the projection surface is light with suppressed speckle noise. Therefore, it is possible to display a satisfactory image without luminance unevenness.

According to still another aspect of the invention, there is provided a monitor apparatus including the light source device and an imaging unit that images a subject illuminated by the light source device.

In the monitor apparatus according to the aspect of the invention, light emitted from the light source device illuminates a subject and the subject is imaged by the imaging unit. In this case, since the light source device emits lights with reduced coherence as described above, the subject is illuminated by bright light without luminance unevenness. Therefore, it is possible to clearly image the subject with the imaging unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
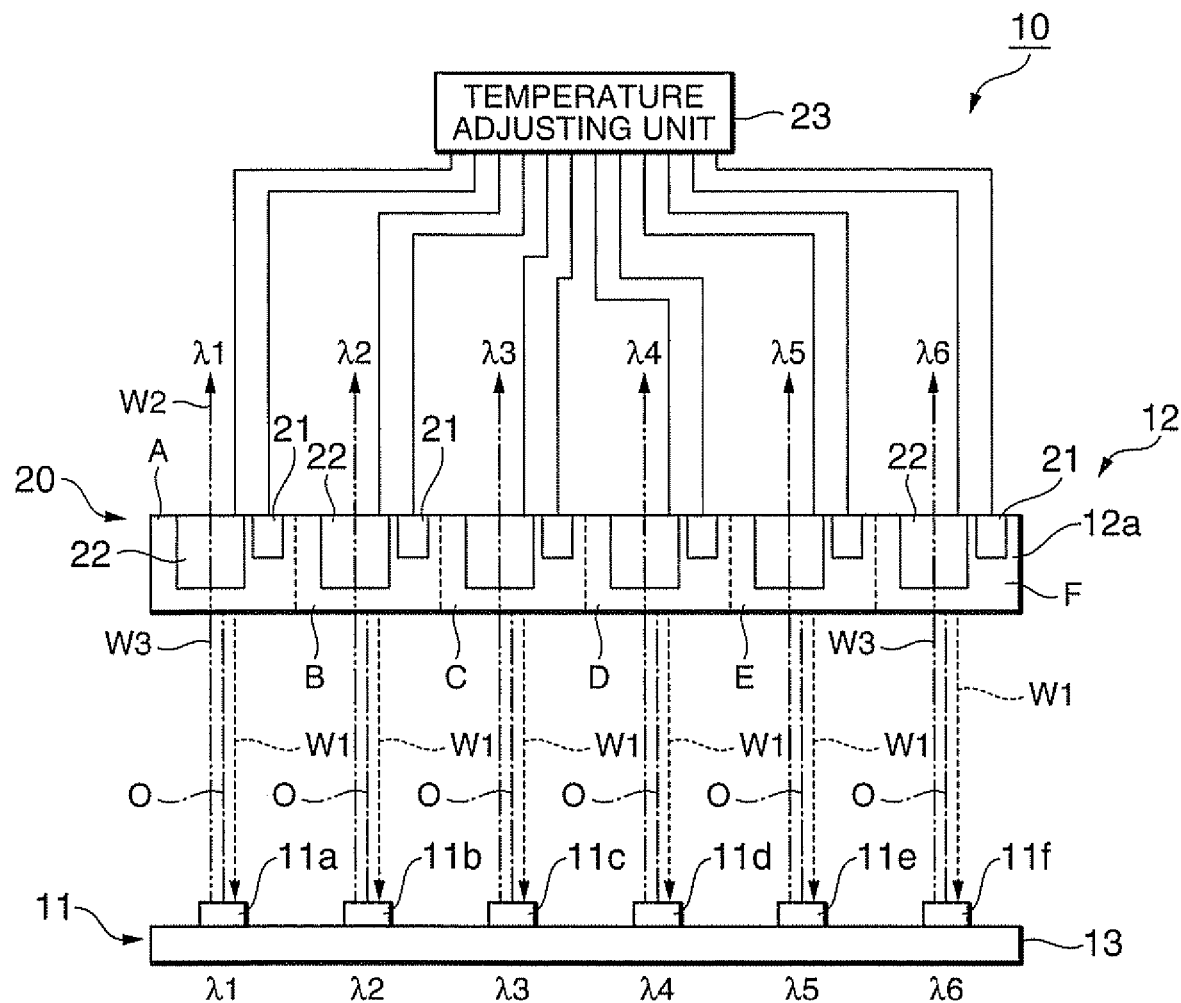
FIG. 1 is a plan view showing a light source device according to a first embodiment of the invention.

A light source device, an image display apparatus, and a monitor apparatus according to embodiments of the invention will be hereinafter explained with reference to the accompanying drawings. In the drawings referred to below, scales of respective members are appropriately changed in order to shown the respective members in recognizable sizes.

First Embodiment

A first embodiment of the invention is explained with reference to FIG. 1.

As shown in FIG. 1, a light source device 10 according to this embodiment includes a light-emitting unit 11, a wavelength selection element 12, and a control unit 20.

The light-emitting unit 11 includes six light-emitting elements (semiconductor lasers; LDs) 11a, 11b, 11c, 11d, 11e, and 11f that emit laser beams. All of these light-emitting elements 11a to 11f are supported by a supporting unit 13. Peak wavelengths of lights emitted from the light-emitting elements 11a to 11f are different by about several nanometers because of manufacturing errors of the light-emitting elements 11a to 11f. When wavelengths of the lights emitted from the light-emitting elements 11a to 11f are represented as $\lambda 1$, $\lambda 2$, $\lambda 3$, $\lambda 4$, $\lambda 5$, and $\lambda 6$, the wavelengths have a relation $\lambda 1 > \lambda 4 > \lambda 5 > \lambda 3 > \lambda 2 > \lambda 6$. Rather than the wavelengths are accidentally different because of the manufacturing errors, light-emitting elements that emit lights having different wavelength may be intentionally used from the beginning of design.

The wavelength selection element 12 functions as a resonator mirror for the light-emitting elements 11a to 11f by selecting a part (about 98 to 99%) of lights (broken lines shown in FIG. 1) W1 having a predetermined selected wavelength among laser beams made incident thereon and reflecting the lights to the light-emitting unit 11. The wavelength selection element 12 transmits the remaining laser beams (alternate long and two short dashes lines shown in FIG. 1)

W2. As the wavelength selection element 12, an optical element like a hologram having a periodic lattice can be used.

Lights of basic waves (solid lines shown in FIG. 1) W3 emitted from the light emitting unit 11 repeat reflection between the light emitting unit 11 and the wavelength selection element 12 and are amplified and, then, emitted from the wavelength selection element 12 as the laser beams W2. The wavelength selection element 12 transmits lights having wavelengths in a certain degree of range. Among the lights, only lights having a predetermined wavelength are amplified. Intensities of the amplified lights are extremely high compared with intensities of the lights having the other wavelengths. Therefore, the lights W2 transmitted through the wavelength selection element 12 can be regarded as lights having a substantially single wavelength. The wavelengths of the lights W2 are substantially identical with the selected wavelengths of the wavelength selection element 12, i.e., the wavelengths of the lights W1 reflected by the wavelength selection element 12. The wavelength selection element 12 reflects a part (about 98-99%) of the lights having a predetermined selected wavelength. Therefore, the remaining (about 1 to 2%) lights are used as output lights.

In one base forming the wavelength selection element 12, areas in which the lights emitted from the light-emitting elements 11a to 11f are selected (light selection areas) are represented as A, B, C, D, E, and F. However, since the areas A to F are actually continuous areas having different selected wavelengths, there is no physical boundary among the areas.

As shown in FIG. 1, the control unit 20 includes temperature sensors (state detecting unit) 21, Peltier elements (state changing unit) 22, and a temperature adjusting unit 23.

The temperature sensors 21 and the Peltier elements 22 are bonded to a surface 12a in the respective areas A to F of the wavelength selection element 12. The temperature sensors 21 and the Peltier elements 22 provided in the respective areas A to F are connected to the temperature adjusting unit 23.

The temperature sensors 21 are sensors that measure the temperatures in the respective areas A to F of the wavelength selecting element 12.

Since the Peltier elements 22 are provided on the surface 12a in the respective areas A to F, the wavelength selection element 12 is heated or cooled from the surface 12a in the respective areas A to F to a rear surface (a surface on a rear side of the paper surface). A refractive index of the wavelength selection element 12 changes as the wavelength selection element 12 expands with the heating and contracts with the cooling. Selected wavelengths of the wavelength selection element 12, i.e., wavelengths of the lights W1 reflected by the wavelength selection element 12 are different according to the refractive index.

The Peltier elements 22 are provided in the respective areas A to F on the surface 12a at predetermined intervals. Heat insulators may be provided among the Peltier elements 22 to prevent heat from being transmitted between adjacent areas of the areas A to F.

The Peltier elements 22 change, according to the temperatures in the areas A to F detected by the temperature sensors 21, states of the areas A to F of the wavelength selection element 12 to make wavelengths of lights selected in the areas A to F different.

The temperature adjusting unit 23 controls, for each of the areas A to F, an electric current supplied to the respective Peltier elements 22 on the basis of the temperatures detected by the temperature sensors 21. The temperature adjusting unit 23 makes the temperature different in each the respective areas A to F and makes a selected wavelength different in each of the areas different. In this way, in this embodiment, the temperatures in the respective areas A to F are individually controlled to make the temperatures in the respective areas A to F different. Consequently, it is possible to make wavelengths of the lights W1 reflected by the wavelength selection element 12 different in the respective areas. Specifically, a selected wavelength shifts further to a long wavelength side in an area having larger thermal expansion at high temperature. In other words, the Peltier element 22 is controlled by the temperature adjusting unit 23 to adjust the temperatures in the respective areas A to F according to the wavelengths of the light-emitting elements 11a to 11f such that, when the wavelengths of the lights W1 reflected in the areas A to F of the wavelength selection element 12 are represented as $\lambda 1$, $\lambda 2$, $\lambda 3$, $\lambda 4$, $\lambda 5$, and $\lambda 6$, respectively, a relation among the wavelength is $\lambda 1 > \lambda 4 > \lambda 5 > \lambda 3 > \lambda 2 > \lambda 6$.

Since the wavelengths of the lights W1 reflected by the wavelength selection element 12 are different in the respective areas A to F, the lights W1 repeat reflection between the light-emitting unit 11 and the wavelength selection element 12 and are amplified and, then, emitted from the wavelength selection element 12 as the lights W2. The lights W2 are different in the respective areas A to F.

A specific example of the light source device 10 according to this embodiment is explained.

The light-emitting elements 11a to 11f are semiconductor lasers for red. The peak wavelength $\lambda 1$, $\lambda 2$, $\lambda 3$, $\lambda 4$, $\lambda 5$, and $\lambda 6$ of lights emitted from the light-emitting elements are 630 nm, 626 nm, 627 nm, 629 nm, 628 nm, and 625 nm, respectively.

The Peltier elements 22 are controlled by the temperature adjusting unit 23 to set selected wavelengths $\lambda 1$, $\lambda 2$, $\lambda 3$, $\lambda 4$, $\lambda 5$, and $\lambda 6$ in the areas A, B, C, D, E, and F of the wavelength selection element 12 to 630 nm, 626 nm, 627 nm, 629 nm, 628 nm, and 625 nm (a difference among the selected wavelengths is 5 nm at the maximum), respectively. Then, wavelengths of the lights W2 emitted from the areas A, B, C, D, E, and F of the wavelength selection element 12 are also 630 nm, 626 nm, 627 nm, 629 nm, 628 nm, and 625 nm, respectively.

Figure 2:
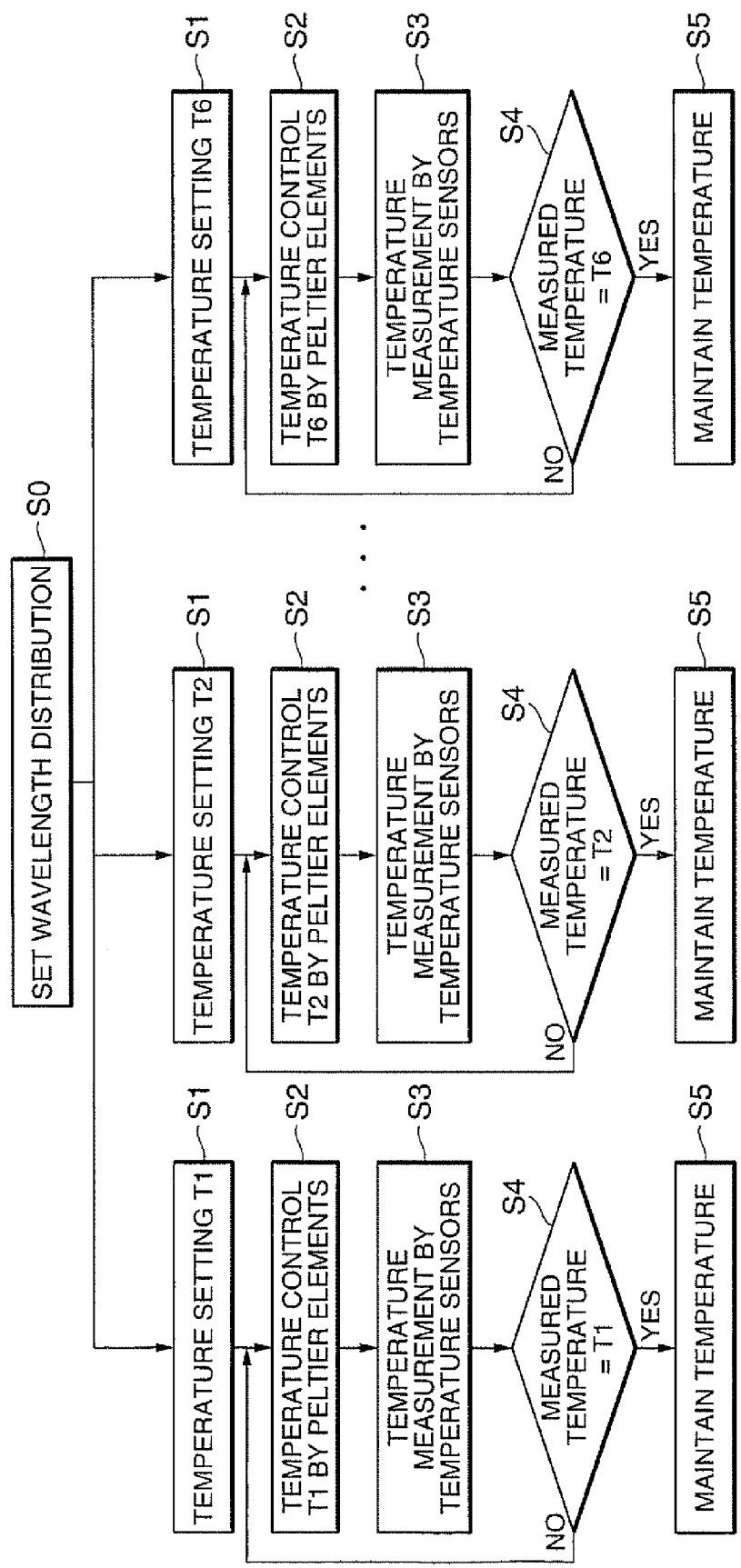
FIG. 2 is a flowchart used for the light source device shown in FIG. 1.

Specific control by the temperature adjusting unit 23 is explained with reference to a flowchart shown in FIG. 2.

It is assumed that a selected wavelength in the area A of the wavelength selection element 12 is 630 nm when temperature is T1, a selected wavelength in the area B of the wavelength selection element 12 is 626 nm when temperature is T2, a selected wavelength in the area C of the wavelength selection area 12 is 627 nm when the temperature is T3, a selected wavelength in the area D of the wavelength selection area 12 is 629 nm when temperature is T4, a selected wavelength in the area E of the wavelength selection element 12 is 628 nm when temperature is T5, and a selected wavelength in the area F of the wavelength selection element 12 is 625 nm when temperature is T6.

First, wavelength distributions in the respective areas A to F are set in the temperature adjusting unit 23 (step S0). The area A is explained as a representative area. When the wavelength distributions are determined, the temperature adjusting unit 23 sets the temperature in the area A to T1 according to a relation between a wavelength and temperature (step S1). The temperature adjusting unit 23 controls the Peltier element 22 to set the temperature in the area A to T1 (step S2). The temperature adjusting unit 23 measures the temperature in the area A using the temperature sensor 21 (step S3) and judges whether the temperature measured by the temperature sensor 21 and the set temperature T1 coincide with each other (step S4). When the temperature measured by the temperature sensor 21 and the set temperature T1 do not coincide with each other ("NO" at step S4), i.e., when the actual temperature in the area A is lower than the set temperature T1, the temperature adjusting unit 23 controls the Peltier element 22 to heat the area A and, when the actual temperature in the area A is higher than the set temperature T1, the temperature adjusting unit 23 controls the Peltier element 22 to cool the area A. By repeating such operation, when the temperature measured by the temperature sensor 21 and the set temperature T1 coincide with each other ("YES" at step S4), the temperature adjusting unit 23 maintains the temperature in the area A without causing the Peltier element 22 to change the temperature (step S5). In this case, in the temperature sensor 21, the temperature in the area A is always or intermittently measured and compared with the set temperature T1. When the temperature in the area A measured by the temperature sensor 21 deviates from the set temperature T1, the temperature adjusting unit 23 controls the Peltier element 22.

In the areas B to F, the same control is performed by the temperature adjusting unit 23.

In the light source device 10 according to this embodiment, since the temperatures in the respective areas A to F are made different from one another by the Peltier elements 22, bands of lights emitted from the wavelength selection element 12 spread wider compared with the case in which lights having an identical wavelength are emitted from all the areas A to F. Since the Peltier elements 22 change the states of the areas A to F of the wavelength selection element 12 according to the temperatures measured by the temperature sensors 21, it is possible to surely make wavelengths of lights emitted from the areas A to F different. Therefore, coherence among laser beams decreases. As a result, it is possible to obtain the light source device 10 with reduced speckle noise.

Since it is possible to change the temperature in each of the areas A to F, a degree of freedom of an output waveform distribution of lights emitted from the wavelength selection element 12 is increased. Therefore, it is possible to align wavelengths of lights emitted from the light-emitting elements 11a to 11f and wavelengths of lights selected in the respective areas A to F of the wavelength selection element 12 corresponding to the light-emitting elements 11a to 11f. Consequently, even if output wavelengths of the light-emitting elements 11a to 11f vary because of manufacturing errors or the like of the light-emitting elements 11a to 11f, it is possible to improve efficiency of use of the lights emitted from the wavelength selection element 12.

In other words, the light source device 10 according to this embodiment can reduce coherence among plural laser beams while maintaining high efficiency of use of lights and suppress speckle noise.

It is also possible that there is no manufacturing error and peak wavelengths of the lights emitted from the light-emitting elements 11a to 11f are the same. In this configuration, although the efficiency of use of light slightly falls, it is possible to reduce speckle noise.

Heat generating elements or piezoelectric elements (distortion giving unit) may be used instead of the Peltier elements 22. The piezoelectric elements displace when a voltage is applied thereto and cause distortion in the wavelength selection element 12 with the displacement. As the distortion of the wavelength selection element 12 is larger, a selected wavelength thereof is shorter. Therefore, it is possible to make wavelengths of the lights emitted from the respective areas A to F different by providing other piezoelectric elements (distortion detecting unit) for detecting distortions of the respective areas A to F and adjusting amounts of distortions of the respective areas A to F with the piezoelectric elements according to the distortions detected by the other piezoelectric elements. As the distortion giving unit, for example, a distortion gauge or a magnetic distortion element may be used.

In the above example, one wavelength selection element 12 is provided for the plural light-emitting elements 11a to 11f and one base is divided into the plural areas. However, wavelength selection elements may be provided individually for respective light-emitting elements.

On Peltier element 22 may collectively control the temperatures in the plural areas A to F, i.e., two or three areas. In this case, as in the above case, temperatures only have to be given to the plural areas A to F to make wavelengths of lights selected in the plural areas A to F different from one another.

First Modification of the First Embodiment

Figure 3:
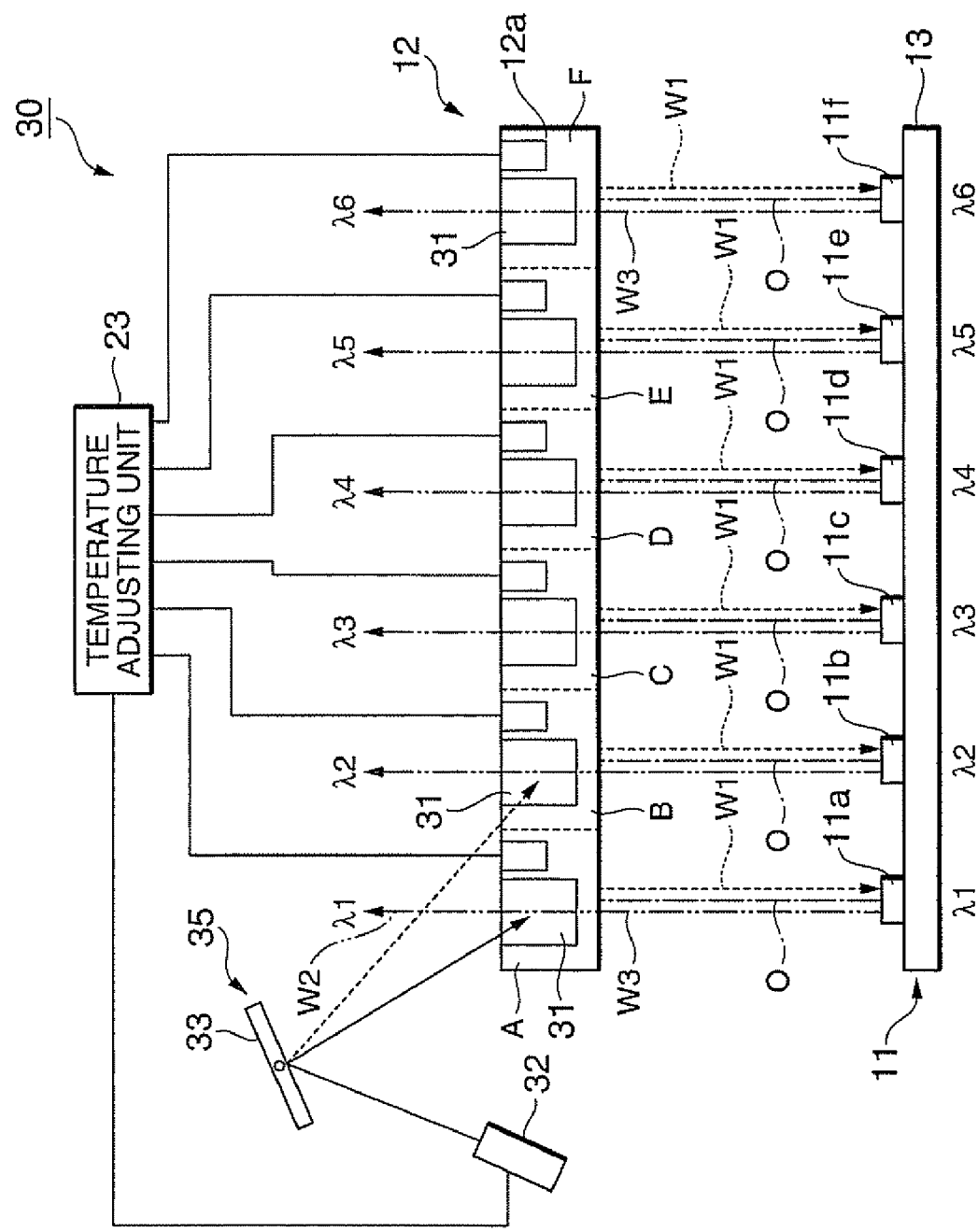
FIG. 3 is a plan view showing a modification of the light source device shown in FIG. 1.

In the first embodiment shown in FIG. 1, the Peltier elements 22 are used in order to change the temperatures in the respective areas A to F. However, a light source device 30 that uses a temperature changing unit (temperature changing unit) 35 instead of the Peltier element 22 as shown in FIG. 3 may be adopted.

The temperature changing unit (the temperature changing unit) 35 used in the light source device 30 includes a laser beam source for heat generation 32, a mirror 33, heat absorbing films 31, and the temperature sensors 21 same as those in the first embodiment.

The heat absorbing films 31 are provided in the respective areas A to F on the surface 12a at predetermined intervals in the same manner as the Peltier elements 22. Heat insulators may be provided among the heat absorbing films 31 in the areas A to F to prevent heat from being transmitted between adjacent areas of the areas A to F. The thicknesses of the heat insulating films 31 are the same in the respective areas A to F.

The mirror 33 scans a laser beam, which is emitted from the laser beam source for heat generation 32, to the heat absorbing films 31. A tilt angle of the mirror 33 is controlled to determine the heat absorbing film 31 in any one of the areas A to F on which light is irradiated. Time for holding the mirror 33 at a certain tilt angle is determined to control irradiation time of the light on the heat absorbing film 31.

Time of irradiation of the laser beam on the heat absorbing films 31 is adjusted. Consequently, as the time of the irradiated laser beam becomes longer, the temperatures of the heat absorbing films 31 rise higher and the temperatures in the areas A to F rise higher. The time of irradiation of the laser beam on the heat absorbing films 31 is controlled to make the temperatures in the areas A to F different from one another. In other words, in this modification, as in the first embodiment, the temperature adjusting unit 23 adjusts an output of the laser beam source for heat generation 32 according to temperatures detected by the temperature sensors 21 provided in the respective areas A to F.

In the light source device 30 according to this modification, as in the light source device according to the first embodiment, it is possible to reduce speckle noise and improve efficiency of use of lights.

In this modification, the thicknesses of the heat absorbing films 31 are the same. However, the thicknesses of the heat absorbing films 31 may be irregular. Since an amount of heat absorption is larger and leads to high temperature as the thicknesses of the heat absorbing films 31 are larger, in this modification, it is possible to give a temperature distribution to the respective areas A to F of the wavelength selection element 12 without changing scanning speed of the mirror 33 (time of irradiation of light on one heat absorbing film 31). In other words, rather than changing irradiation time of a laser beam for each of the areas A to F, scanning speed for each scanning in which the mirror 33 is swung from the area A to the area F only has to be fixed. Therefore, it is easy to control the mirror 33.

Although the heat absorbing films 31 are provided in the respective areas A to F, the heat absorbing films 31 may be provided over the entire surface of the surface 12a of the wavelength selection element 12.

An MEMS mirror can also be used as the mirror 83.

Second Modification of the First Embodiment

In the first embodiment shown in FIG. 1, when the temperatures in the respective areas A to F reach the set temperature, the temperatures are always maintained (selected wavelengths of the respective areas A to F are temporally fixed). However, the temperatures in the respective areas A to F may be temporally changed.

Figure 4:
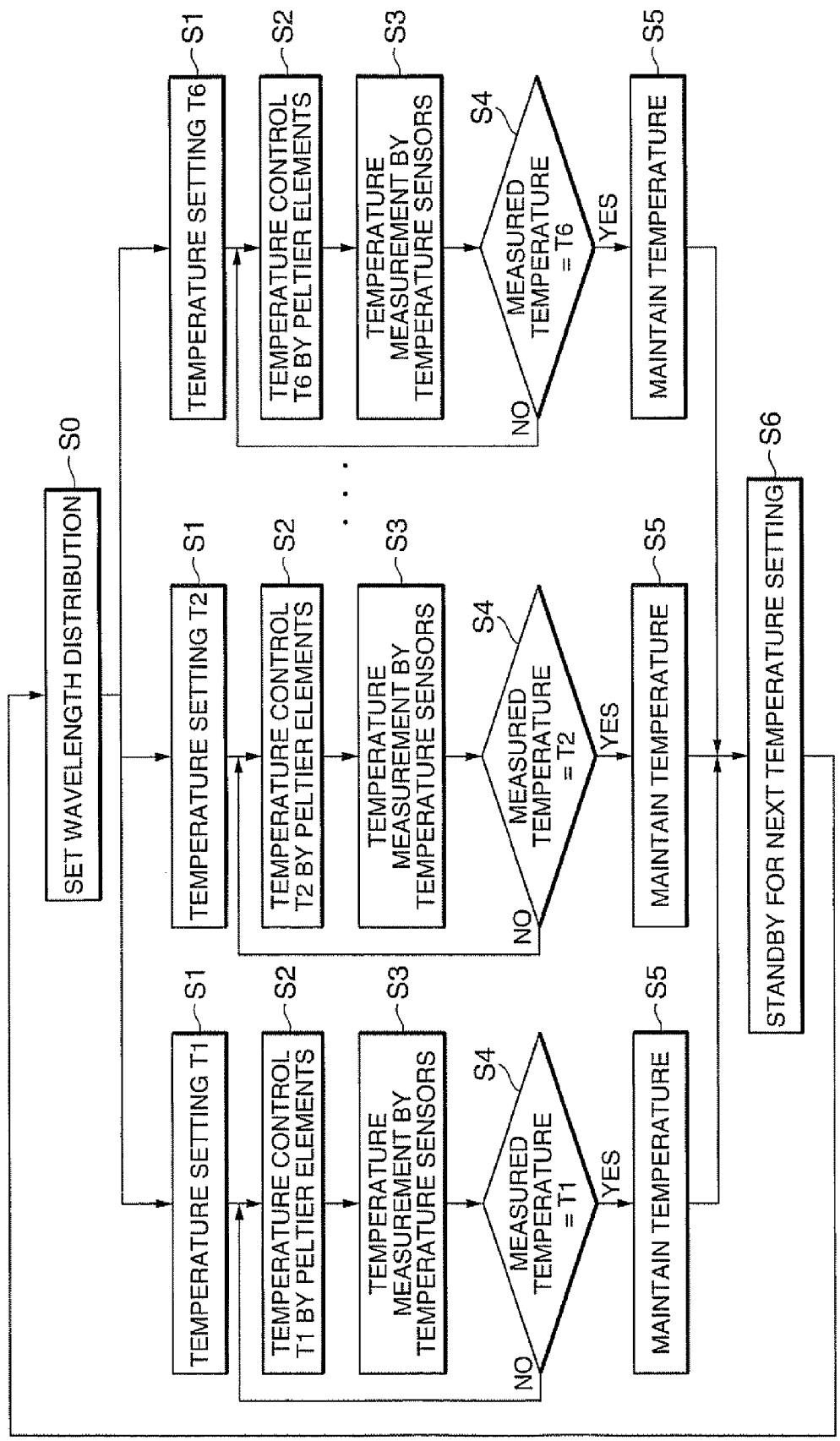
FIG. 4 is a flowchart for explaining a modification of the light source device shown in FIG. 1.

As shown in a flowchart of FIG. 4, first, a temperature change pattern according to the elapse of time in the respective areas A to F is set as a time table (wavelength distribution setting) in the temperature adjusting unit 23 (step S0). As in the first embodiment, the temperature adjusting unit 23 adjusts the temperatures in the respective areas A to F and, after temperature measured by the temperature sensor 21 and the set temperature T1 coincide with each other, maintains the temperature (step S5). Thereafter, the temperature adjusting unit 23 stands by for the next temperature setting (step S6) and returns to step S0 and temperatures at the time in the respective areas A to F are set (step S0). In this case, temperatures different from the immediately preceding set temperatures are set as the temperatures in the respective areas A to F. When the temperatures in the respective areas A to F are temporally changed in this way, degrees of thermal expansion in the respective areas A to F change, the refractive index changes, and selected wavelengths are temporally different. Therefore, wavelengths of the lights emitted from the respective areas A to F temporally change.

In this modification, since the temperatures in the areas A to F are temporally changed, a speckle pattern of lights emitted from the areas A to F complexly changes as time elapses. According to the change, visually recognized speckles (spot patterns due to interference) move. Therefore, the speckle patterns are integrated and averaged in an after-image time of human eyes and it is possible to reduce occurrence of speckles.

Second Embodiment

A second embodiment according to the invention is explained with reference to FIG. 5. In the drawings in respective embodiments explained below, components same as those of the light source device 10 according to the first embodiment are denoted by the same reference numerals and signs and explanation of the components is omitted.

A light source device 40 according to this embodiment is different from the light source device 10 of the first embodiment in that the light source device 40 includes a light-intensity adjusting unit 45 that adjusts intensities of lights emitted from the areas A to F. Otherwise, the light source device 40 is the same as the light source device 10 according to the first embodiment.

Figure 5:
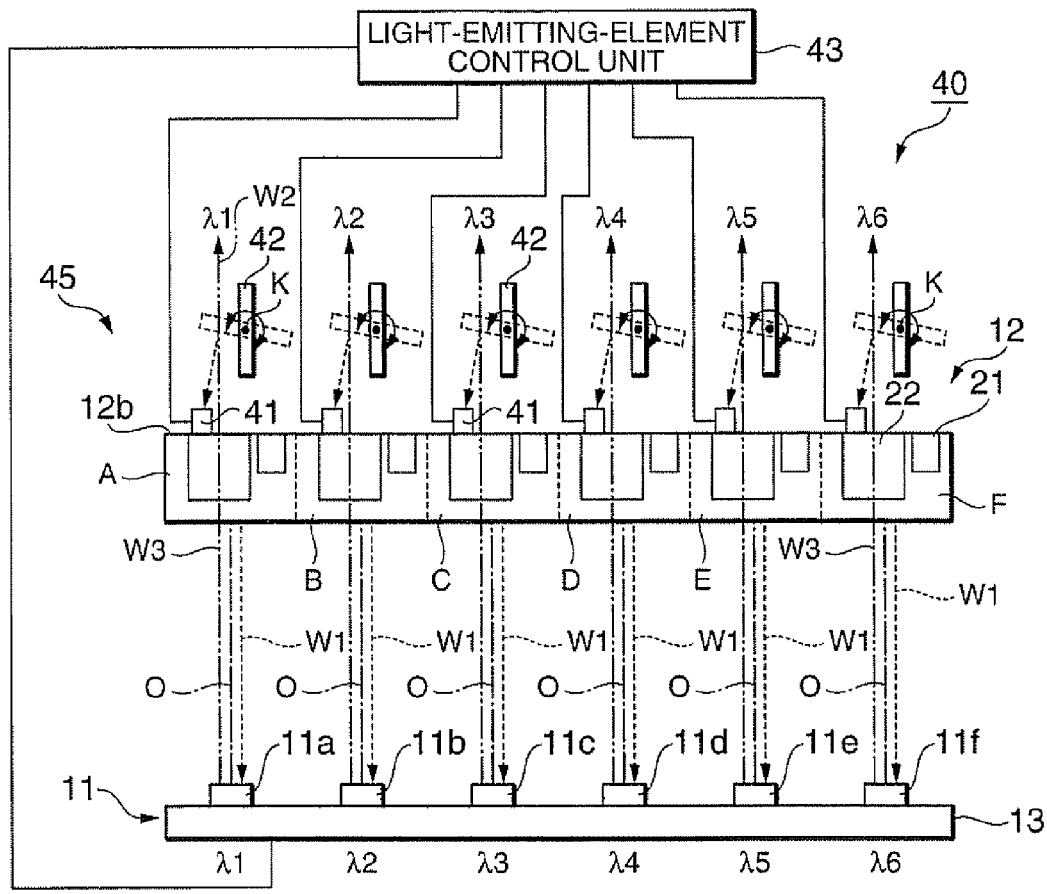
FIG. 5 is a plan view showing a light source device according to a second embodiment of the invention.

As shown in FIG. 5, the light-intensity adjusting unit 45 includes light intensity sensors (light-intensity detecting unit) 41, mirrors 42, and a light-emitting-element control unit 43. In this embodiment, the light source device 40 includes the temperature adjusting unit 23 same as that in the first embodiment. However, in FIG. 5, the temperature adjusting unit 23 is not shown in the figure for simplification of the figure.

The light intensity sensors 41 are provided in positions deviating from center axes O of lights emitted from the light emitting elements 11a to 11f on emission end faces 12b of the wavelength selection element 12.

The mirrors 42 are provided in association with the respective areas A to F on the emission end faces 12b side of the wavelength election element 12 and are rotatable around shafts K. The mirrors 42 reflect the lights emitted from the respective areas A to F, respectively, according to the rotation of the shafts K and make the lights incident on the light intensity sensors 41 provided on the emission end faces 12b.

The light-emitting-element control unit 43 adjusts, on the basis of light intensities detected by the light intensity sensors 41, outputs of the lights emitted from the respective light-emitting elements 11a to 11f.

Actions of the light-intensity adjusting unit 45 are explained.

When lights are emitted from the light-emitting elements 11a to 11f, the mirrors 42 rotate about 80° counterclockwise with the center axes O of the lights as references around the centers of the shafts K at each fixed time. Intensities of the lights reflected on the mirrors 42 are detected by the light intensity sensors 41. When the light intensities detected by the light intensity sensors 41 are smaller than a predetermined value, the light-emission-element control unit 43 increases light outputs of the light-emitting elements 11a to 11f that emit lights to the areas. When the light intensities are larger than the predetermined value, the light-emission-element control unit 43 decreases the light outputs of the light-emitting elements 11a to 11f that emit lights to the areas. In this way, the light-emitting-element control unit 43 uniformalizes the intensities of the lights emitted from the respective areas A to F of the wavelength selection element 12.

In the light source device 40 according to this embodiment, the intensities of the lights emitted from the respective areas A to F of the wavelength selection element 12 can be uniformalized. Consequently, compared with the case in which the intensities of the lights emitted from the respective areas A to F of the wavelength selection element 12 are non-uniform, when the intensities of the lights are uniform as in this embodiment, the effect of speckle reduction at the time when waveforms are made different is larger. In other words, it is possible to more effectively decrease coherence of the lights emitted from the waveform selection element 12.

Figure 6:
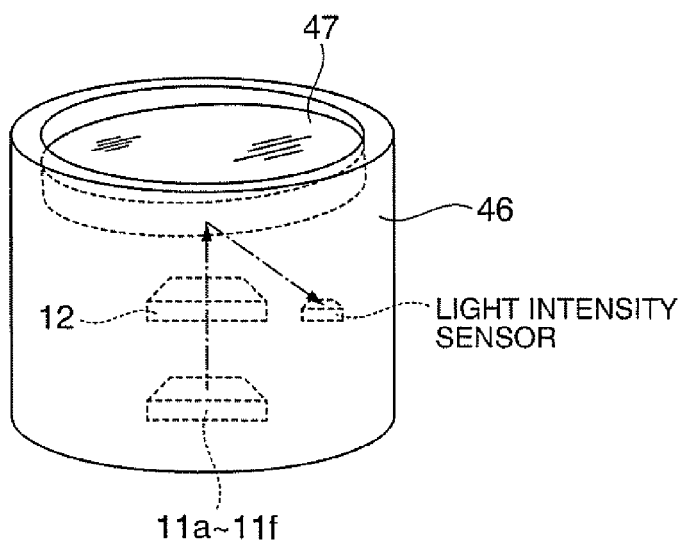
FIG. 6 is a perspective view showing a modification of the light source device shown in FIG. 5.

In this embodiment, the mirrors 42 are provided to measure the intensities of the lights emitted from the wavelength selection element 12. However, the mirrors 42 do not have to be provided. It is also possible that, as shown in FIG. 6, glass 47 fit in a cap 46 provided on the outside of the light-emitting elements 11a to 11f and the wavelength selection element 12 is inclined and a part of light transmitted through the wavelength selection element 12 are reflected on the glass 47 to detect light intensities with a light intensity sensor. In the case of this configuration, the light intensity sensor only has to be arranged in a position where lights reflected by the cap 46 can be detected.

Positions where the light intensity sensors 41 are provided are not limited to the emission end face 12b.

The outputs of the lights emitted from the respective light-emitting elements 11a to 11f are adjusted on the basis of the light intensities detected by the light intensity sensors 41. However, output intensities may be adjusted by feeding back the light intensities to the Peltier elements 22 provided in the wavelength selection element 12 and adjusting the temperatures in the respective areas A to F of the wavelength selection element 12 to change output waveforms. In this configuration, although efficiency of use of light slightly falls, since it is unnecessary to provide the light-emitting-element control unit 43, it is possible to realize a reduction in cost.

Third Embodiment

A third embodiment of the invention is explained with reference to FIG. 7.

Figure 7:
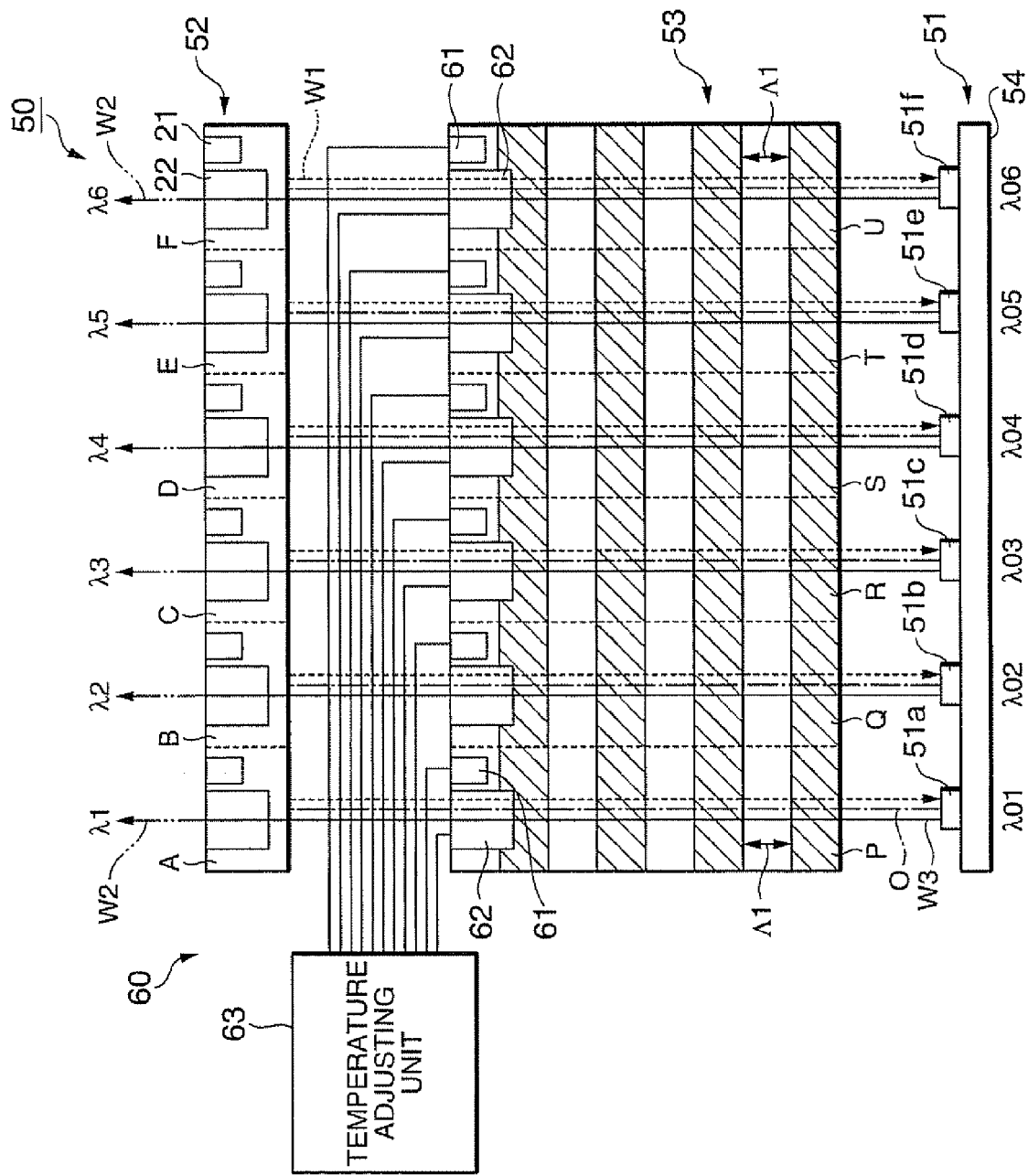
FIG. 7 is a plan view showing a light source device according to a third embodiment of the invention.

As shown in FIG. 7, a light source device 50 according to this embodiment includes a light-emitting unit 51, a wavelength conversion element 53 that converts a waveform of light emitted from the light-emitting unit 51, and a wavelength selection element 52 that selects the wavelength converted by the wavelength conversion element 53 and reflects the light.

In FIG. 7, the temperature adjusting unit 23 on the wavelength selection element 52 side is not shown for simplification of the figure.

The light-emitting unit 51 includes six light-emitting elements (semiconductor lasers; LDs) 51, 51b, 51c, 51d, 51e, and 51f that emit laser beams. All of these light-emitting elements 51a to 51f are supported by a supporting unit 54. Peak wavelengths of lights emitted from the light-emitting elements 51a to 51f are different by about several nanometers because of manufacturing errors of the light-emitting elements 51a to 51f. When wavelengths of the lights emitted from the light-emitting elements 51a to 51f are represented as λ01, λ02, λ03, λ04, λ05, and λ06, the wavelengths have a relation λ01>λ04>λ05>λ03>λ02>λ06. Light-emitting elements that emit lights having different wavelength may be intentionally used.

The wavelength conversion element (a second harmonic-wave generating element, SHG) 53 is a nonlinear optical element that converts incident light into light having about a half wavelength. Lights W3 emitted from the light-emitting unit 51 and travel to the wavelength selection element 52 pass through the wavelength conversion element 53 to be converted into light having about a half wavelength. Wavelength conversion efficiency by the wavelength conversion element 53 has a nonlinear characteristic. For example, as intensity of a laser beam made incident on the wavelength conversion element 53 is higher, the conversion efficiency is improved. However, the conversion efficiency of the wavelength conversion element 53 is about 40 to 50%. In other words, not all laser beams emitted from the light-emitting unit 51 are converted into laser beams having a predetermined wavelength.

As the wavelength conversion element 53, a plate-shaped element is used. The wavelength conversion element 53 is divided into five areas P, Q, R, S, T, and U in association with the plural light-emitting elements 51a to 51e. Areas through which lights emitted from the light-emitting elements 51a, 51b, 51c, 51d, 51e, and 51f pass are represented as areas (light passing areas) P, Q, R, S, T, and U, respectively.

The wavelength conversion element 53 has a polarization periodic structure in each of the areas P to U, i.e., a repeated structure of domains with polarizations inverted from one another. When light is transmitted through the polarization periodic structure, a wavelength of the incident light is converted. Widths in a center axis O direction of laser beams of respective domains of the areas P, Q, R, S, T, and U of the wavelength conversion element 53 (hereinafter referred to as "pitches") Λ1 are identical.

When such a polarization periodic structure is formed, first, stripe-like electrode patterns in which areas with electrodes and areas without electrodes are alternately arranged along the center axis O direction of laser beams is formed on a substrate made of a nonlinear ferroelectric material (e.g., LiTaO$_3$). Subsequently, a pulse-like voltage is applied to the electrode patterns, whereby the polarization periodic structure shown in FIG. 7 is obtained. After the polarization periodic structure is formed in this way, usually, the electrode patterns are removed but may be left as they are.

As described above, the wavelength conversion element 53 has the polarization inversion structure in which the periods (pitches) are identical in the areas P to U.

As shown in FIG. 7, a control unit 60 includes temperature sensors (state detecting unit) 61, Peltier elements (state changing unit) 62, and a temperature adjusting unit 63.

The temperature sensors 61 and the Peltier elements 62 are bonded to a surface 53a in the respective areas A to F of the wavelength conversion element 53. The temperature sensors 61 and the Peltier elements 62 provided in the respective areas P to U are connected to the temperature adjusting unit 63.

The temperature sensors 61 are sensors that measure the temperatures in the respective areas P to U of the wavelength conversion element 53. Since the Peltier elements 62 are provided on the surface 53a in the respective areas P to U, the wavelength conversion element 53 is heated or cooled from the surface 53a in the respective areas P to U to a rear surface (not shown). Like the wavelength selection element 52, the wavelength conversion element 53 expands with the heating and contracts with the cooling and a domain pitch thereof changes. Conversion wavelengths of the wavelength conversion element 53, i.e., wavelengths of lights W1 converted by the wavelength conversion element 53 are different according to the domain pitch.

The Peltier elements 62 change states of the areas P to U of the wavelength conversion element 53 such that wavelengths of lights converted in the areas P to U are different from one another according to temperatures in the areas P to U detected by the temperature sensors 61.

Wavelengths in the case of a blue light source device are explained as an example. Peak wavelengths of lights emitted from the light-emitting elements 51a to 51f, respectively, are λ01=920 nm, λ02=914 nm, λ03=912 nm, λ04=916 nm, λ05=918 nm, and λ06=910 nm. However, the wavelengths are only an example.

In the areas P, temperature is set to temperature T2a for converting light having a wavelength of 920 nm into light having a half wavelength by the Peltier element 62. In the areas Q, temperature is set to temperature T2b for converting light having a wavelength of 914 nm into light having a half wavelength by the Peltier element 62. In the area R, temperature is set to temperature T2c for converting light having a wavelength of 912 nm into light having a half wavelength by the Peltier element 62. In the area S, temperature is set to temperature T2d for converting light having a wavelength of 916 nm into light having a half wavelength by the Peltier element 62. In the area T, temperature is set to temperature T2e for converting light having a wavelength of 918 nm into light having a half wavelength by the Peltier element 62. In the area U, temperature is set to temperature T2f for converting light having a wavelength of 910 nm into light having a half wavelength by the Peltier element 62. The Peltier elements 62 are controlled by the temperature adjusting unit 63 to set the temperatures T2a to T2f in the respective areas P to U. Consequently, the wavelengths of the lights emitted from the respective areas P to U of the wavelength conversion element 53 are as follows: λ1=460 nm, λ2=457 nm, λ3=456 nm, λ4=458 nm, λ5=459 nm, and λ6=455 nm.

As in the first embodiment, the wavelength selection element 52 includes the temperature sensors 21, the Peltier elements 22, and the temperature adjusting unit 23.

The wavelength selection elements 52 selects only the laser beams W1 having wavelengths converted into predetermined wavelength λ1 to λ6 by the wavelength conversion element 53 (i.e., wavelengths λ01 to λ06) (i.e., lights not converted by the wavelength conversion element 53 and transmitted) and reflects the laser beams W1 to the light-emitting unit 51 and transmits the other laser beams. The Peltier elements 22 are controlled such that the wavelengths λ01 to λ06 converted in the areas P to U and wavelength of lights selected in the areas A to E of the wavelength selection element 52 take the same values, respectively.

In other words, in the case of the blue light source device, the temperature adjusting unit 23 controls the temperatures in the respective areas A to F with the Peltier elements 22 such that wavelengths of lights reflected in the areas A to F are different from one another.

The lights W1 (alternate long and two short dashes lines shown in FIG. 7) reflected by the wavelength selection element 52 pass through the wavelength conversion element 53 again and return to the light-emitting elements 51a to 51e. A part of the lights returning to the light-emitting elements 51a to 51e are absorbed in the light-emitting elements 51a to 51e and change to heat. However, most of the lights are used as energy for light emission and reflected in the light-emitting elements 51a to 51e and emitted from the light-emitting elements 51a to 51e again to be effectively used.

On the other hand, the lights W2 (alternate long and short dash lines shown in FIG. 7) having wavelengths converted into the wavelength λ1 to λ6, which pass through the wavelength selection element 52, by the wavelength conversion element 53 are transmitted through the wavelength selection element 52.

As explained above, the lights W3 emitted from the light-emitting unit 51 repeat reflection between the light-emitting unit 51 and the wavelength selection element 52. The converted lights W2, wavelengths of which are converted into the predetermined wavelength, (alternate long and short dash line shown in FIG. 7) are emitted from the wavelength selection element 52. In other words, although the wavelength selection element 52 has actions slightly different from those of the wavelength selection element 12 according to the first embodiment, the wavelength selection element 52 has a function of a resonator mirror of the light-emitting elements 51a to 51e.

In the light source device 50 according to this embodiment, it is possible to make wavelengths of lights emitted from the wavelength selection element 52 different from one another by combining the wavelength conversion element 53 that makes it possible to convert wavelengths into the different wavelength λ1 to λ6 by changing the domain pitches of the respective areas P to U with the Peltier elements 62 and the wavelength selection element 52 having a different selected wavelength in each of the areas A to F. Therefore, since bands of lights emitted from the wavelength selection element 52 spread wider compared with the case in which lights having an identical wavelength are emitted from all the areas A to F, coherence among laser beams decreases. As a result, it is possible to obtain the light source device 50 with suppressed speckle noise.

Since the Peltier elements 62 are provided in the respective areas P to Tr a degree of freedom of an output wavelength distribution of lights emitted from the wavelength conversion element 53 increases. Therefore, it is possible to align the wavelengths of the lights emitted from the light-emitting elements 51a to 51e and the wavelengths of the lights converted in the respective areas P to U of the wavelength conversion element 53 corresponding to the light-emitting elements 51a to 51e. Consequently, even if output waveforms of the light-emitting elements 51a to 51e vary because of manufacturing errors and the like of the light-emitting elements 51a to 51e, it is possible to improve efficiency of use of lights emitted from the wavelength conversion element 53.

Moreover, since the Peltier elements 62 are provided in the respective areas P to U, a difference among converted wavelengths in the areas P to T is not limited to 2 nm but can be increased or decreased. Therefore, it is possible to more efficiently reduce speckle noise.

Heat generating elements or piezoelectric elements (distortion giving unit) may be used instead of the Peltier elements 22. The piezoelectric elements displace when a voltage is applied thereto and cause distortion in the wavelength conversion element 53 with the displacement. As the distortion of the wavelength conversion element 53 is larger, a selected wavelength thereof is shorter. Therefore, it is possible to make wavelengths of the lights emitted from the respective areas P to U different by adjusting amounts of distortions of the respective areas P to U. As the distortion giving unit, for example, a distortion gauge or a magnetic distortion element may be used.

The wavelengths of the lights emitted from the respective areas P to U may be made different by using the temperature changing unit 35 shown in FIG. 3 in the first modification of the first embodiment.

Figure 8:
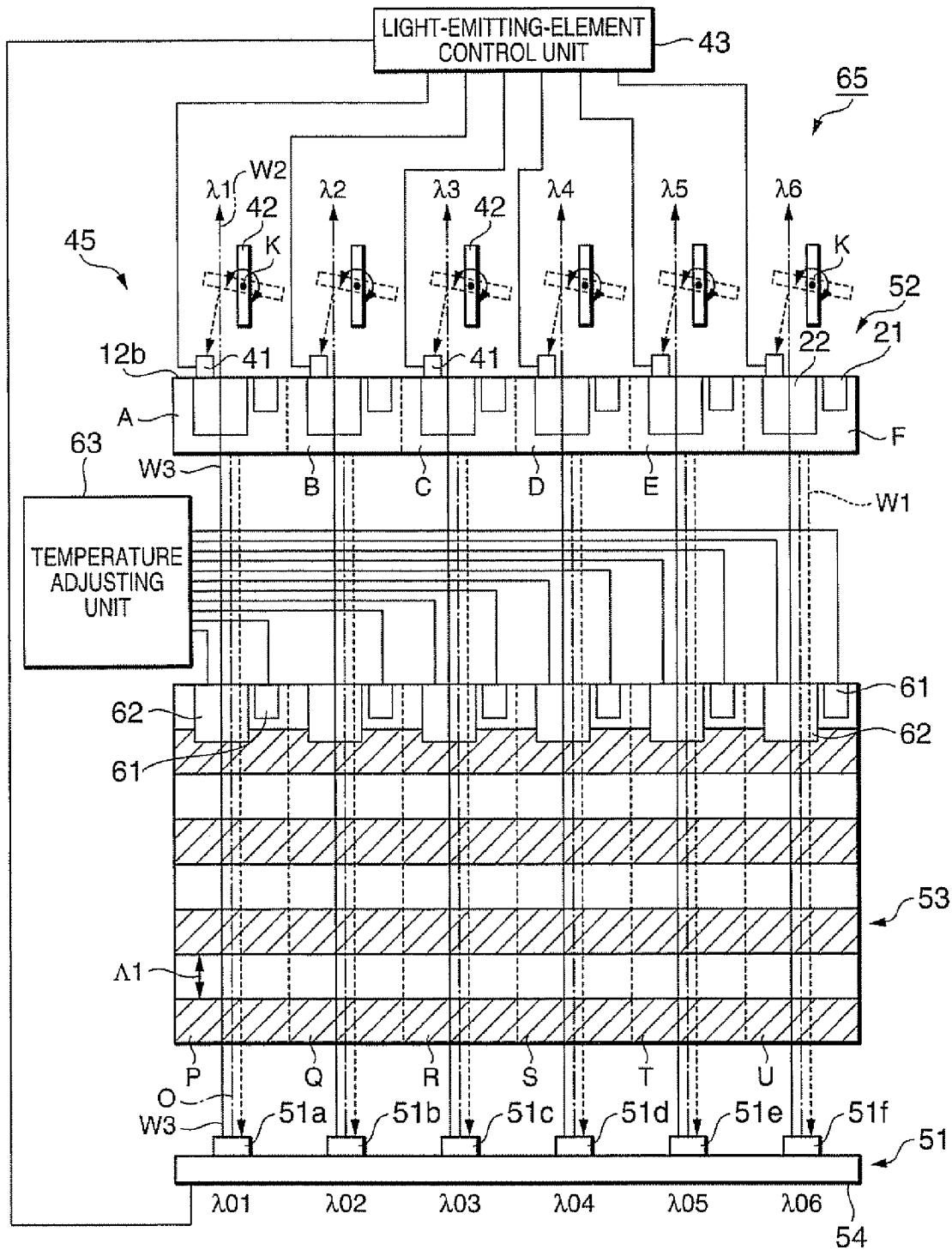
FIG. 8 is a plan view showing a modification of the light source device shown in FIG. 7.

A light source device 65 shown in FIG. 8 including the light-intensity adjusting unit 45 shown in FIG. 5 in the second embodiment may be adopted. Even in the case of this configuration, as in the second embodiment, the intensities of the lights emitted from the respective areas A to F of the wavelength selection element 52 can be uniformalized. Therefore, it is possible to more effectively reduce coherence of the lights emitted from the wavelength selection element 52.

Modification of the Third Embodiment

In the third embodiment shown in FIG. 7, when the temperatures in the respective areas P to U reach the set temperature, the temperatures are always maintained (selected wavelengths of the respective areas P to U are temporally fixed). However, a light source device in which the temperatures in the respective areas P to U are temporally changed may be adopted.

Moreover, in a light source device according to a modification of the third embodiment, temperatures in the respective areas P to U of the wavelength conversion element 53 are controlled to synchronize with temperatures in the respective areas A to F of the wavelength selection element 52 corresponding to the respective areas P to U. The overall structure of the light source device is the same as that of the light source device 50 according to the third embodiment.

Figure 9:
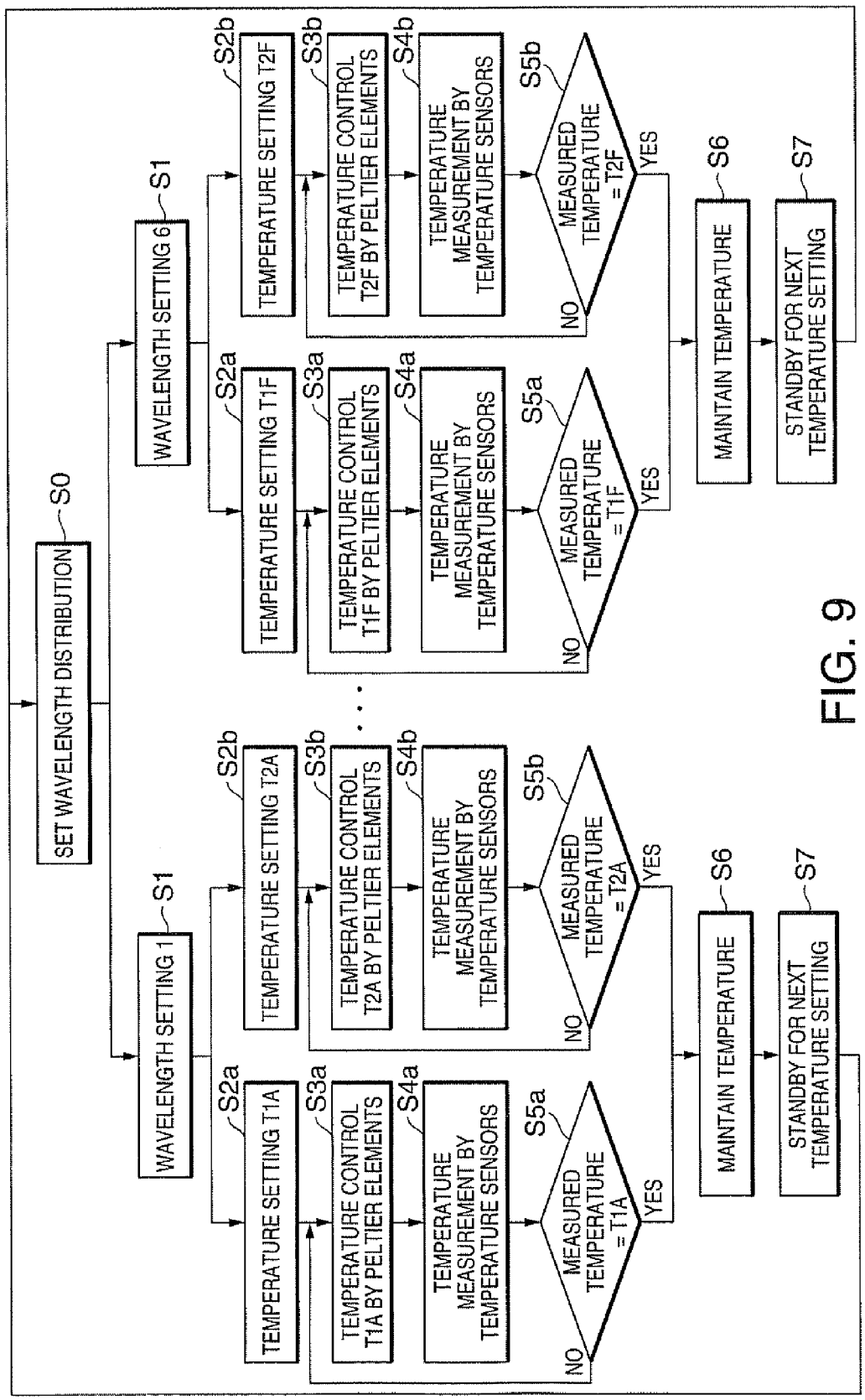
FIG. 9 is a flowchart for explaining a modification of the light source device shown in FIG. 8.

In the light source device according to this modification, as shown in a flowchart of FIG. 9, a temperature change pattern according to the elapse of time in the respective areas A to F is set as a time table (wavelength distribution setting) in the temperature adjusting unit 23 and a temperature change pattern according to the elapse of time in the respective areas P to U is set as a wavelength distribution in the temperature adjusting unit 63 (step S0).

Since flowcharts for the respective areas P to U are the same, control of the areas P and the areas A corresponding to the light-emitting element 51a shown on the left side of FIG. 9 is explained.

First, a wavelength of light emitted from the wavelength selection element 52 at certain time is set (step S1). Temperature T1a of the wavelength selection element 52 that emits the light having the wavelength is set (step S2a). The wavelength selection element 52 controls the temperatures in the respective areas A with the Peltier elements 22 in the same manner as the first embodiment (step S3a) and measures the temperatures in the respective areas A with the temperature sensors 21 (step S4a). The wavelength selection element 52 compares the temperatures measured by the temperature sensors 21 and the set temperature T1a (step S5a) and, after the temperatures and the set temperature T1a coincide with each other, maintains the temperatures (step S6).

Simultaneously with the flow of steps S1a to S5a of the wavelength selection element 52, in the wavelength conversion element 53, in the same manner, temperature T2a of the wavelength conversion element 53 that converts light having a set wavelength is set (step S2b) The wavelength conversion element 53 controls the temperatures in the respective areas P with the Peltier elements 62 (step S3b) and measures the temperatures in the respective areas P with the temperature sensors 61 (step S4b). Thereafter, the wavelength conversion element 53 compares the temperatures measured by the temperature sensors 61 and the set temperature T2a (step S5b) and, after the temperatures and the set temperature T2a coincide with each other, maintains the temperatures (step S6).

Thereafter, the wavelength selection element 52 stands by for the next temperature setting (step S7) and returns to step S0 and temperatures at the time in the respective areas A and P are set (step S0). In this case, temperatures different from the immediately preceding set temperatures are set as the temperatures in the respective areas A and also, temperatures different from the immediately preceding set temperatures are set as the temperatures in the respective areas P.

In this case, temperature control for the respective areas A to F is performed by the Peltier elements 22 of the wavelength selection element 52 and temperature control for the respective areas P to U is performed by the Peltier elements 62 of the wavelength conversion element 53 such that the temperatures of the wavelength selection element 52 and the temperatures of the wavelength conversion element 53 change in synchronization with each other.

For example, when the temperature adjusting unit 63 sets the areas P of the wavelength conversion element 53 to the temperature T2a for converting light having a wavelength of 918 nm into light having a half wavelength, the temperature adjusting unit 63 sets the areas A of the wavelength selection element 52 to the temperature T1a for reflecting the light having the wavelength of 918 nm. It is possible to improve efficiency of use of lights in the wavelength selection element 52 by changing the temperatures of the wavelength selection element 52 and the temperatures of the wavelength conversion element 53 in synchronization with each other.

In this modification, when the temperatures in the areas A to F of the wavelength selection element 52 and the temperatures in the areas P to U of the wavelength conversion element 53 are temporally changed, a speckle pattern of lights emitted from the areas A to F complexly changes as time elapses. According to the change, visually recognized speckles (spot patterns due to interference) move. Therefore, the speckle patterns are integrated and averaged in an after-image time of human eyes and it is possible to reduce occurrence of speckles.

Moreover, since the temperatures of the wavelength selection element 52 and the temperatures of the wavelength conversions element 53 change in synchronization with each other, wavelengths of the lights converted in the respective areas P to U of the wavelength conversion element 53 are identical with wavelength of the lights selected in the respective areas A to U of the wavelength selection element 52 corresponding to the areas P to U. Consequently, the respective lights converted in the respective areas P to U of the wavelength conversion element 53 are effectively extracted when the lights are transmitted through the respective areas P to U of the wavelength selection element 52 corresponding to the areas P to U.

The temperatures in the areas of at least one of the wavelength selection element 52 and the wavelength conversion element 53 may be temporally changed.

As shown in FIG. 5, the light source device according to this modification may include the light-intensity adjusting unit 45 described in the second embodiment. By providing the light-intensity adjusting unit 45 in this modification, the speckle patterns are integrated and averaged in an after-image time of human eyes while coherence of lights emitted from the wavelength selection element 12 is decreased. Therefore, it is possible to more effectively reduce speckle noise.

Fourth Embodiment

A fourth embodiment of the invention is explained with reference to FIGS. 10 and 11.

A light source device 80 according to this embodiment is different from the light source device 50 according to the third embodiment in that, instead of the Peltier elements 62, electrodes (state changing unit: voltage applying unit) 85 are provided on a surface 81a including areas P to U of a wavelength conversion element 81.

In the wavelength conversion element 81 according to this embodiment, the sheet-like electrodes 85 are provided in the areas P to U on the surface 81a, respectively, to keep a predetermined interval between electrodes adjacent to each other.

Figure 10:
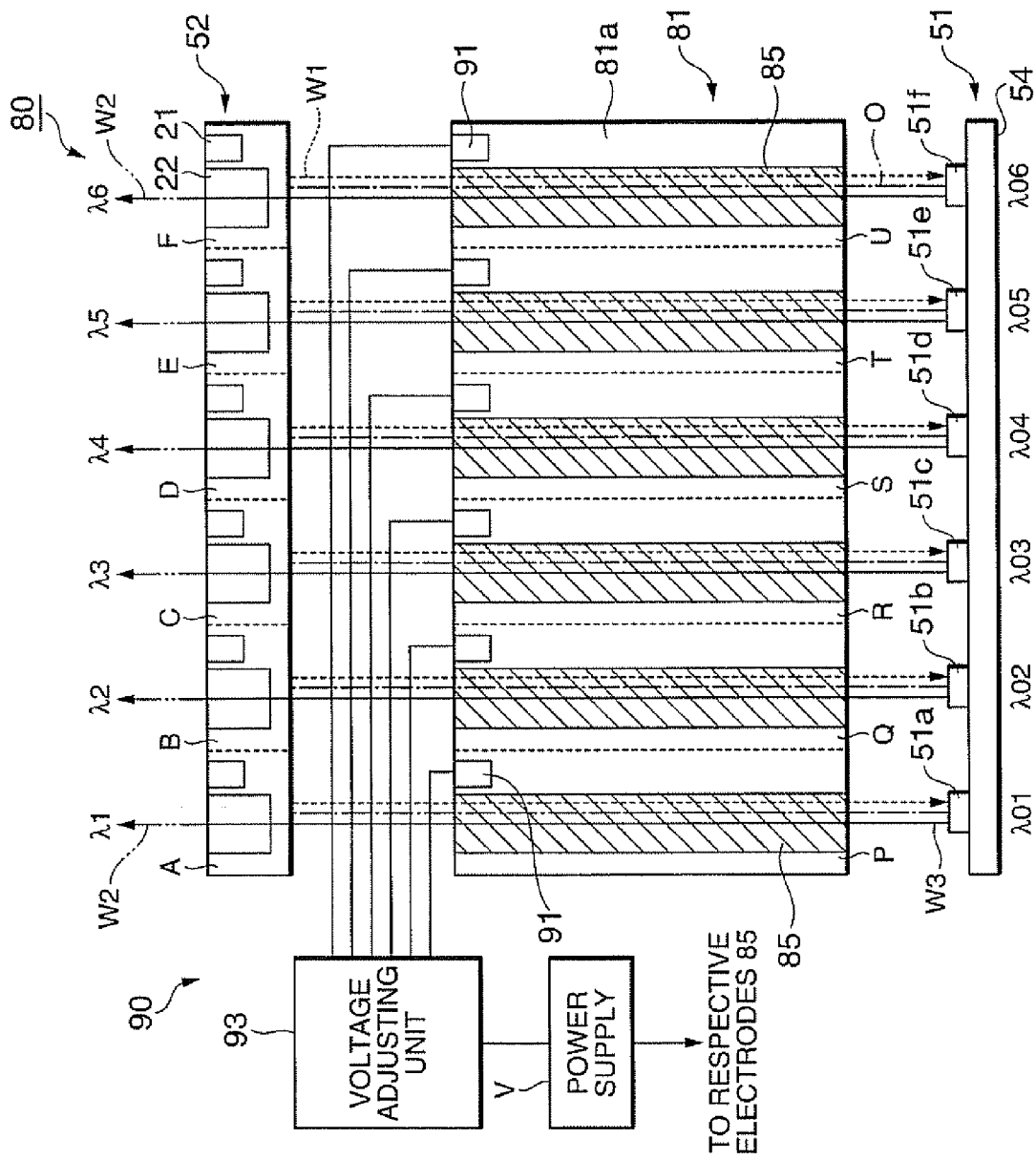
FIG. 10 is a plan view showing a light source device according to a fourth embodiment of the invention.

As shown in FIG. 10, a control unit 90 includes voltage measurement elements (state detecting unit) 91, a power supply (state changing unit) V, and a voltage adjusting unit 93.

The voltage measurement elements 91 and the electrodes 85 are bonded to the surface 81a in the areas P to U of the wavelength conversion element 81, respectively. The voltage measurement elements 91 provided in the respective areas P to U are connected to the voltage adjusting unit 93. The electrodes 85 are connected to the voltage adjusting unit 93 via the power supply V.

The voltage measurement elements 91 are elements that measure the temperatures in the respective areas P to U of the wavelength conversion element 81. A refractive index of the wavelength conversion element 81 changes when a voltage is applied thereto. Converted wavelengths of the wavelength conversion element 81, i.e., wavelengths of the lights W1 converted by the wavelength conversion element 81 are different according to the refractive index.

Voltages different from one another are applied to the respective electrodes 85 by the power supply V. The respective areas P to T have different temperatures according to the applied voltages. According to the difference in the temperatures, in the areas P to U of the wavelength conversion element 81, the temperatures change and a change in domain pitches due to thermal expansion occurs. The different voltages are controlled to be applied to the electrodes 85.

In FIG. 10, only the electrodes 85 formed on the surface 81a are shown. However, six electrodes forming pairs with the electrodes 85 are formed on a surface on the opposite side of the surface 81a. The areas P to U are held by the electrodes forming the pairs to apply predetermined voltages to the areas P to U, respectively.

As in the modification of the third embodiment, the temperatures in the respective areas P to U are temporally changed to control refractive indexes of the respective areas P to U of the wavelength conversion element 81 to synchronize with the temperatures in the respective areas A to F of the wavelength selection element 52 corresponding to the areas P to U.

Figure 11:
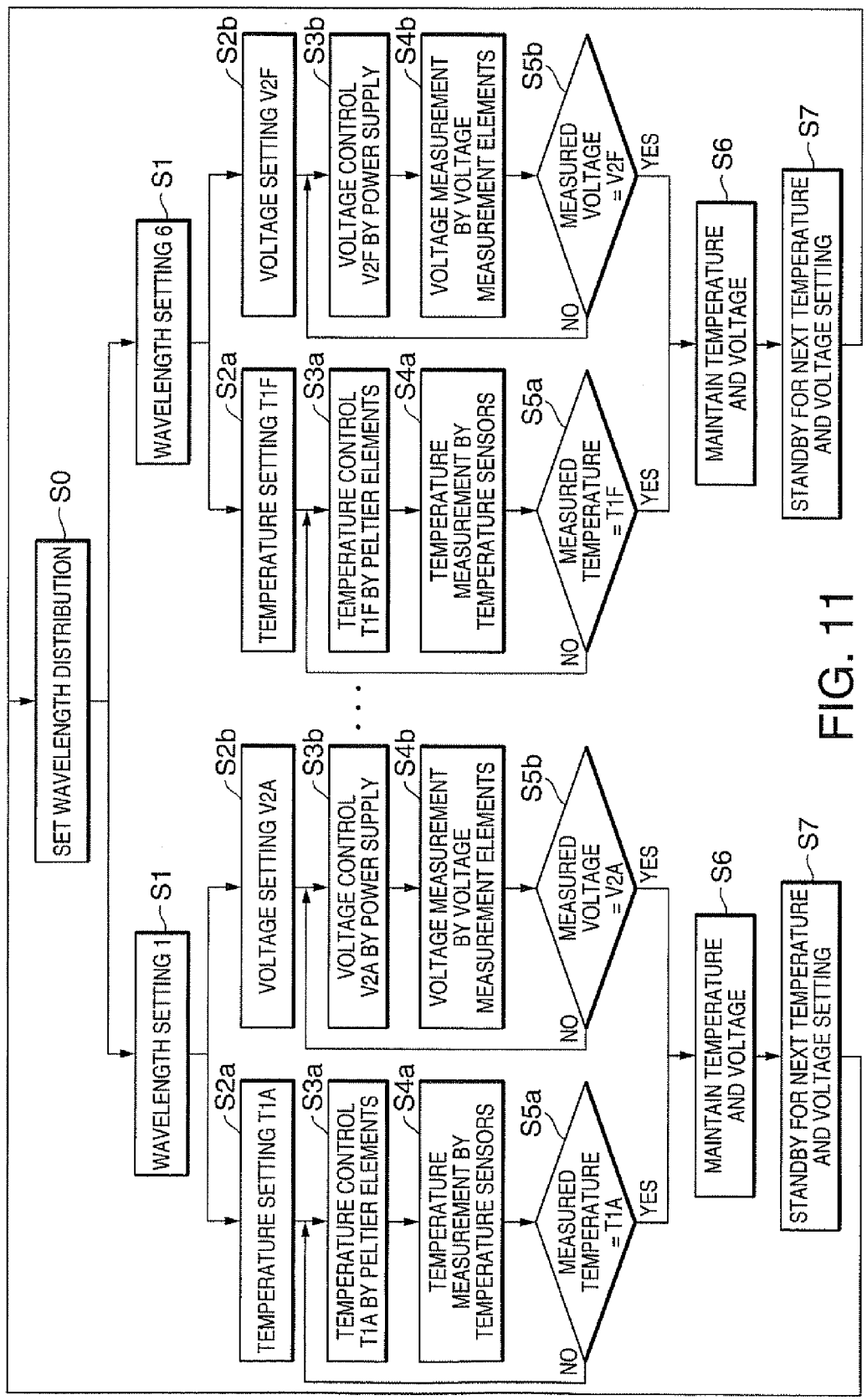
FIG. 11 is a flowchart used for the light source device shown in FIG. 10.

As shown in a flowchart of FIG. 11, first, a temperature change pattern according to the elapse of time in the respective areas A to F is set as a time table (wavelength distribution setting) in the temperature adjusting unit 23 and a temperature change pattern according to the elapse of time in the respective areas P to U is set as a wavelength distribution in the temperature adjusting unit 63 (step S0).

Since a flowchart for the wavelength selection element 52 is the same as that shown in FIG. 9, control by the wavelength conversion element 53 is explained.

First, a wavelength of light emitted from the wavelength conversion element 53 at certain time is set (step S1). A voltage value V2$a$ of the wavelength conversion element 53 that emits the light having the wavelength is set (step S2$b$). The wavelength conversion element 53 controls voltage values applied to the respective areas P to U by the power supply V (step S3$b$) and measures voltages in the respective areas P to U with the voltage measurement elements 91 (step S4$b$). Thereafter, the wavelength conversion element 53 compares the voltage values measured by the voltage measurement elements 91 and the set voltage value V2$a$ (step S5$b$) and, after the voltage values and the set voltage value V2$a$ coincide with each other, maintains the voltage values (step S6).

Thereafter, the wavelength selection element 52 stands by for the next temperature setting. The wavelength conversion element 53 stands by for the next voltage setting (step S7) and returns to step S0, Temperatures at the time in the respective areas A to F and voltages at the times in the respective areas P to U are set (step S0). In this case, temperatures different from the immediately preceding set temperatures are set as the temperatures in the respective areas A to F. Voltage values different from the immediately preceding set voltage values are set as voltage values in the respective areas P to U.

In this case, temperature control for the respective areas A to F is performed by the Peltier elements 22 of the wavelength selection element 52 and voltage control for the respective areas P to U is performed by the voltage measurement elements 91 of the wavelength conversion element 81 such that the temperatures of the wavelength selection element 52 and the voltage values of the wavelength conversion element 53 change in synchronization with each other.

When a voltage value V2$a$ for converting light having a wavelength of 918 nm into light having a half wavelength is set in the areas P of the wavelength conversion element 81, temperature T1$a$ for reflecting the light having the wavelength of 918 nm is set in the areas A of the wavelength selection element 52. By changing the temperatures of the wavelength selection element 52 and the voltage values of the wavelength conversion element 81 are changed in synchronization with each other in this way, it is possible to improve efficiency of use of lights in the wavelength selection element 52.

In the light source device 80 according to this embodiment, an effect same as that in the third embodiment can be obtained. Since the light source device 80 makes wavelength of the lights emitted from the respective areas P to U different by changing voltages applied to the respective areas P to U, it is easy to control the wavelength conversion element 81.

Fifth Embodiment

A fifth embodiment according to the invention is explained with reference to FIG. 12.

Figure 12:
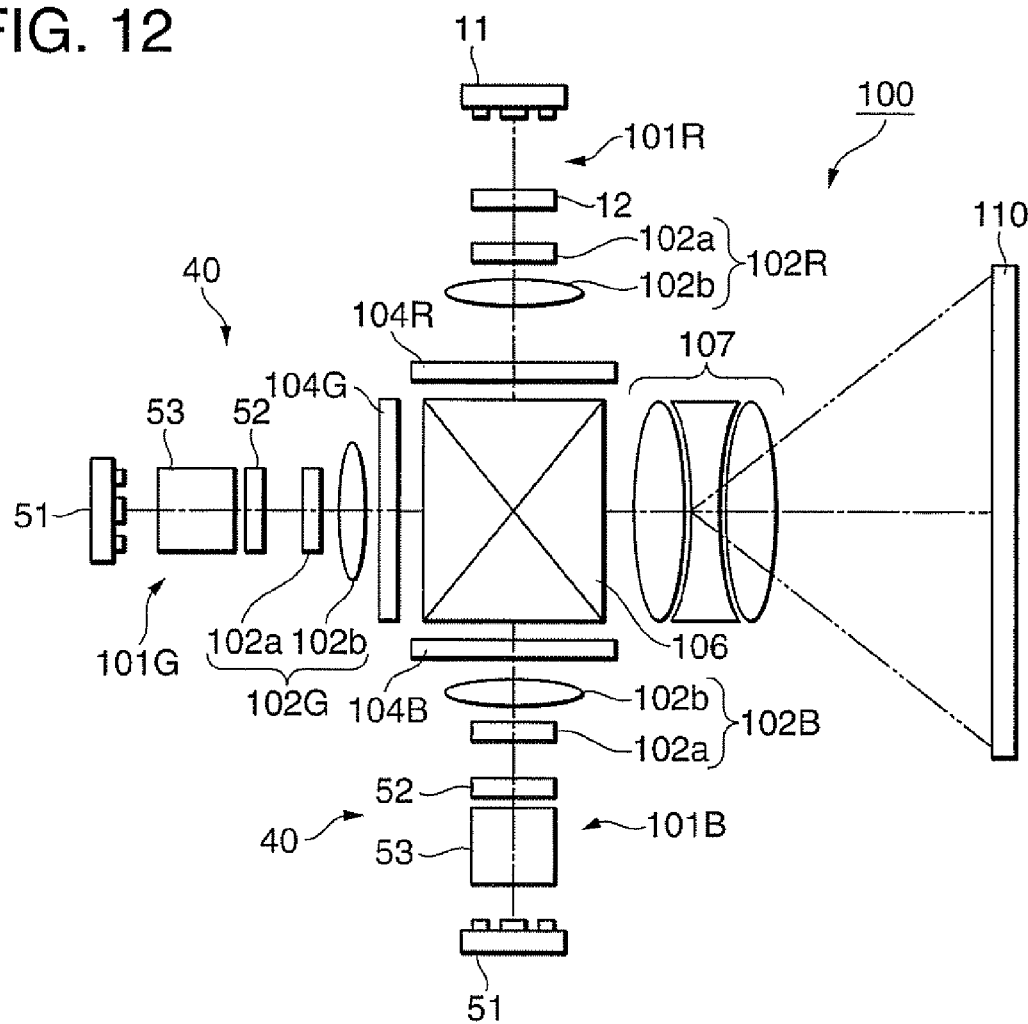
FIG. 12 is a plan view showing an image display apparatus according to a fifth embodiment of the invention.

In this embodiment, an image display apparatus 100 including the light source device 10 according to the first embodiment is explained, In FIG. 12, a housing forming the image display apparatus 100 is not shown for simplification of the figure.

In the image display apparatus 100, the light source device 10 according to the first embodiment is used as a red laser beam source (light source device) 101R that emits red light. The light source device 50 according to the third embodiment is used as a green laser beam source (light source device) 101G and a blue laser beam source (light source device) 101B that emit green light and blue light.

The image display apparatus 100 includes liquid crystal light valves (light modulating devices) 104R, 104G, and 104B that modulate laser beams emitted from the laser beam sources 101R, 101G, and 101B, respectively, a cross-dichroic prism (color light combining unit) 106 that combines lights emitted from the liquid crystal light valves 104R, 104G, and 104B and leads to the combined light to a projection lens 107, and the projection lens (a projecting device) 107 that enlarges an image formed by the liquid crystal light valves 104R, 104G, and 104B and projects the image on a screen 110.

Moreover, in the image display apparatus 100, in order to uniformalize an illuminance distribution of the laser beams emitted from the laser beam sources 101R, 101G, and 101B, uniformalizing optical systems 102R, 102G, and 102B are provided further on an optical path downstream side than the respective laser beam sources 101R, 101G, and 101B. The liquid crystal light valves 104R, 104G, and 104B are illuminated by the light, the illuminance distribution of which is uniformalized by the uniformalizing optical systems. For example, the uniformalizing optical systems 102R, 102G, and 102B include holograms 102$a$ and field lenses 103$b$.

The three color lights modulated by the respective liquid crystal light valves 104R, 104G, and 104B are made incident on the cross-dichroic prism 106. The prism is formed by bonding four rectangular prisms. A dielectric multilayer film that reflects red light and a dielectric multilayer film that reflects blue light are arranged in a cross shape in the inside of the cross-dichroic prism 106. The three color lights are combined by these dielectric multilayer films and light representing a color image is formed. The combined light is projected on the screen 110 by the projection lens 107 serving as a projection optical system and an enlarged image is displayed.

In the image display apparatus 100 according to this embodiment, the lights emitted by the red laser beam source 101R, the green laser beam source 101G, and the blue laser beam source 101B are light with reduced coherence. Therefore, the light projected by the projection lens 107 is light with suppressed speckle noise. Therefore, a satisfactory image can be displayed on the screen 110.

In the image display apparatus according to this embodiment, the light source device 50 according to the third embodiment is used as the green and blue laser beam sources 101G and 101B. However, it is also possible to use the light source devices according to the other embodiments. In this case, it is possible to adopt the light source devices according to the different embodiments as the respective light source devices 101R, 101G, and 101B. It is also possible to adopt the light source devices of the same embodiment.

A transmissive liquid crystal light valve is used as the light modulating device. However, light valves other than the liquid crystal light valve may be used or a reflective light valve may be used. Examples of such light valves include a reflective liquid crystal light valve and a digital mirror device. A configuration of a projection optical system is appropriately changed according to a type of a light valve in use.

Figure 13:
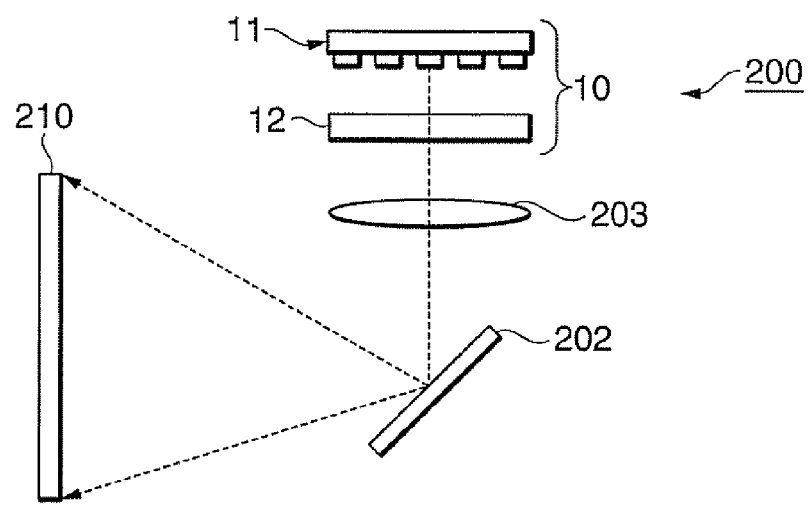
FIG. 13 is a plan view showing a modification of the image display apparatus of the invention.

The light source devices according to the first to fourth embodiments (including the modifications) are also applied to a scanning image display apparatus. An example of such an image display apparatus is shown in FIG. 13. An image display apparatus 200 shown in FIG. 13 includes the light source device 10 according to the first embodiment, an MEMS mirror (scanning unit) 202 that scans light emitted from the light source device 10 to a screen 210, and a condenser lens 203 that condenses the light emitted from the light source device 10 on the MEMS mirror 202. By moving the MEMS mirror 202, the light emitted from the light source device 10 is guided to perform scanning on the screen 210 in lateral and longitudinal directions. When a color image is displayed, plural light-emitting elements forming the light-emitting unit 11 only have to be formed by a combination of light-emitting elements having peak wavelengths of red, green, and blue.

Sixth Embodiment

Figure 14:
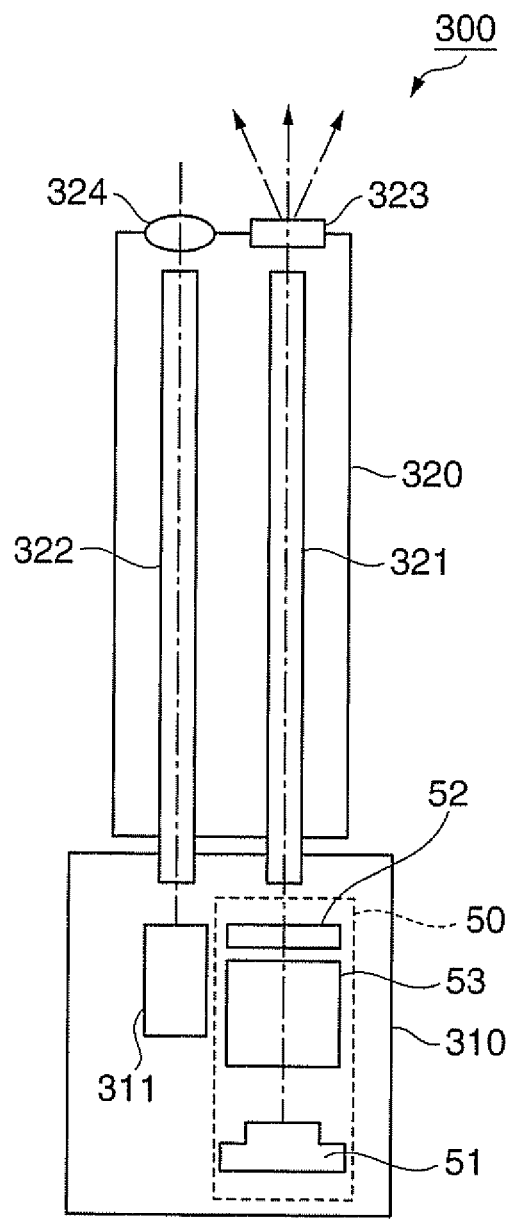
FIG. 14 is a plan view showing a monitor apparatus according to a sixth embodiment of the invention.

An example of the structure of a monitor apparatus 300 to which the light source device 50 according the third embodiment is applied is explained. FIG. 14 is a schematic diagram schematically showing the monitor apparatus 300. The monitor apparatus 300 includes an apparatus main body 310 and a light transmitting unit 320. The apparatus main body 310 includes the light source device 10 according to the first embodiment.

The light transmitting unit 320 includes two light guides 321 and 322 on a light sending side and a light receiving side. The respective light guides 321 and 322 are formed by binding a large number of optical fibers and can send laser beams to a distance. The light source device 10 is disposed on an incidence side of the light guide 321 on the light sending side and a diffuser 323 id disposed on an emission side thereof. A laser beam emitted from the light source device 10 is sent to the diffuser 323 provided at a distal end of the light transmitting unit 320 through the light guide 321 and diffused by the diffuser 323 to illuminate a subject.

An imaging lens 324 is also provided at the distal end of the light transmitting unit 320. Reflected light from the subject can be received by the imaging lens 324. The received reflected light is sent to a camera 311 serving as imaging unit provided in the apparatus main body 310 through the light guide 322 on the receiving side. As a result, an image based on the reflected light obtained by illuminating the subject with the laser beam emitted from the light source device 10 can be photographed by the camera 311.

With the monitor apparatus 300 configured as described above, the light source device 50 emits light with suppressed speckle noise. Therefore, it is possible to clearly photograph the subject with the camera 311.

In the above explanation, the light source device 50 according to the third embodiment is used as the monitor apparatus according to the sixth embodiment. However, it is also possible to use the light source devices according to the other embodiments (including the modifications).

The technical scope of the invention is not limited to the embodiments. Various modifications of the embodiments are possible without departing from the spirit of the invention.

For example, the cross-dichroic prism is used as the color light combining unit. However the color light combining unit is not limited to this. As the color light combining unit, for example, it is possible to use dichroic mirrors arranged in a cross to combine color lights and dichroic mirrors arranged in parallel to combine color lights.

The entire disclosure of Japanese Patent Application No. 2007-183345, filed Jul. 12, 2007 is expressly incorporated by reference herein.

What is claimed is:

1. A light source device comprising:
    plural light-emitting elements that emit lights;
    a wavelength selection element that has plural light selection areas in which wavelength selection is performed for the lights emitted from the plural light-emitting elements, respectively, and selectively reflects a part of the lights emitted from the plural light-emitting elements;
    a state detecting unit that detects states of the plural light selection areas of the wavelength selection element; and
    a state changing unit that changes, according to the states of the plural light selection areas detected by the state detecting unit, the states of the light selection areas of the wavelength selection element to make wavelengths of the lights selected in the plural light selection areas different from one another.

2. The light source device according to claim 1, wherein the state detecting unit and the state changing unit are provided for each of the light selection areas of the wavelength selection element.

3. The light source device according to claim 1, wherein the states of the plural light selection areas are temporally changed by the state changing unit.

4. The light source device according to claim 1, further comprising a light-intensity detecting unit that detects intensities of the lights emitted from the plural light selection areas, wherein
    intensities of the lights emitted from the plural light-emitting elements are adjusted on the basis of the intensities of the lights detected by the light-intensity detecting unit, respectively.

5. The light source device according to claim 1, wherein
    the state detecting unit is a temperature detecting unit that detects the temperatures in the light selection areas of the wavelength selection element, and
    the state changing unit is a temperature changing unit that makes, according to the temperature detected by the temperature detecting unit, the temperatures in the light selection areas of the wavelength selection element different from one another.

6. The light source device according to claim 1, wherein
    the state detecting unit is a distortion detecting unit that detects magnitudes of distortions of the light selection areas of the wavelength selection element, and
    the state changing unit is a distortion giving unit that makes, according to the magnitudes of the distortions detected by the distortion detecting unit, the magnitudes of the distortions of the light selection areas of the wavelength selection element different from one another.

7. An image display apparatus comprising:
    the light source device according to claim 1;
    a light modulating device that modulates light emitted from the light source device according to an image signal; and
    a projecting device that projects an image formed by the light modulating device.

8. An image display apparatus comprising:
    the light source device according to claim 1; and
    a scanning unit that scans light emitted from the light source device on a projection surface.

9. A monitor apparatus comprising:
the light source device according to claim 1; and
an imaging unit that images a subject illuminated by the light source device.

10. A light source device comprising:
plural light-emitting elements that emit lights;
a wavelength conversion element that has plural light passing areas through which the lights emitted from the plural light-emitting elements pass, respectively, and converts wavelengths of at least a part of the lights emitted from the plural light-emitting elements into lights having a predetermined wavelength, respectively;
a wavelength selection element that has plural light selection areas in which the lights emitted from the plural light passing areas of the wavelength conversion element are selected, respectively, and selectively reflects a part of the lights emitted from the wavelength conversion element to the light-emitting element;
a conversion-side-state detecting unit that detects states of the plural light passing areas of the wavelength conversion element;
a conversion-side-state changing unit that changes, according to the states of the plural light passing areas detected by the conversion-side-state detecting unit, the state of the light passing areas of the wavelength conversion element to make wavelength of the lights converted in the plural light passing areas different from one another;
a selection-side-state detecting unit that detects states of the plural light selection areas of the wavelength selection element; and
a selection-side-state changing unit that changes, according to the states of the plural light selection areas detected by the selection-side-state detecting unit, the states of the light selection areas of the wavelength selection element to make wavelengths of the lights selected by the plural light selection areas different from one another.

11. The light source device according to claim 10, wherein
the conversion-side-state detecting unit and the conversion-side-state changing unit are provided in each of the light passing areas of the wavelength conversion element,
the selection-side-state detecting unit and the selection-side-state changing unit are provided in each of the light selection areas of the wavelength selection element, and
states of the respective areas are changed by the conversion-side-state changing unit and the selection-side-state changing unit such that converted wavelengths of the respective light passing areas of the wavelength conversion element and selected wavelengths of the respective light selection areas of the wavelength selection element change while substantially coinciding with each other.

12. The light source device according to claim 10, wherein at least one of the states of the plural light passing areas and the states of the plural light selection areas are temporally changed.

13. The light source device according to claim 10, further comprising a light-intensity detecting unit that detects intensities of the lights emitted from the plural light selection areas, respectively, wherein
intensities of the lights emitted from the plural light-emitting elements are adjusted on the basis of the intensities of the lights detected by the light-intensity detecting unit, respectively.

14. The light source device according to claim 10, wherein
the wavelength conversion element has a repeated structure of domains with polarizations inverted from one another along center axes of lights emitted from the plural light-emitting elements,
the conversion-side-state detecting unit is a voltage detecting unit that detects voltages in the light passing areas of the wavelength conversion element, and
the conversion-side-state changing unit is a voltage applying unit that makes, according to the voltages detected by the voltage detecting unit, voltages applied to the light passing areas of the wavelength conversion element different from one another.

15. The light source device according to claim 10r wherein
the selection-side-state detecting unit is a temperature detecting unit that detects the temperatures in the light selection areas of the wavelength selection element, and
the selection-side-state changing unit is a temperature changing unit that makes temperatures in the light selection areas of the wavelength selection element different from one another according to the temperatures detected by the temperature detecting unit.

16. The light source device according to claim 10, wherein
the selection-side-state detecting unit is a distortion detecting unit that detects magnitudes of distortions of the light selection areas of the wavelength selection element, and
the selection-side-state changing unit is a distortion giving unit that makes magnitudes of the distortions of the light selection areas of the wavelength selection element different from one another according to the magnitudes of the distortions detected by the distortion detecting unit.

17. An image display apparatus comprising:
the light source device according to claim 10;
a light modulating device that modulates light emitted from the light source device according to an image signal; and
a projecting device that projects an image formed by the light modulating device.

18. An image display apparatus comprising:
the light source device according to claim 10; and
a scanning unit that scans light emitted from the light source device on a projection surface.

19. A monitor apparatus comprising:
the light source device according to claim 10; and
an imaging unit that images a subject illuminated by the light source device.

* * * * *